(12) United States Patent
Becker

(10) Patent No.: US 11,049,984 B2
(45) Date of Patent: Jun. 29, 2021

(54) OPTIMIZED STATIC RADIATION COLLECTOR

(71) Applicant: SOLIGHT LTD, Tirat Hacarmel (IL)

(72) Inventor: Ofer Becker, Haifa (IL)

(73) Assignee: SOLIGHT LTD, Tirat Hacarmel (IL)

( * ) Notice: Subject to any disclaimer, the term of this patent is extended or adjusted under 35 U.S.C. 154(b) by 322 days.

(21) Appl. No.: 16/069,323

(22) PCT Filed: Jan. 9, 2017

(86) PCT No.: PCT/IL2017/050024
§ 371 (c)(1),
(2) Date: Jul. 11, 2018

(87) PCT Pub. No.: WO2017/122193
PCT Pub. Date: Jul. 20, 2017

(65) Prior Publication Data
US 2019/0019898 A1    Jan. 17, 2019

(30) Foreign Application Priority Data
Jan. 13, 2016    (IL) .......................... 243601

(51) Int. Cl.
*H01L 31/0232* (2014.01)
*G02B 19/00* (2006.01)
(Continued)

(52) U.S. Cl.
CPC .......... *H01L 31/0232* (2013.01); *F24S 23/70* (2018.05); *F24S 23/79* (2018.05);
(Continued)

(58) Field of Classification Search
CPC ............. H01L 31/0232; H01L 31/0547; H01L 31/0525; F24S 23/70; F24S 50/80; F24S 23/79; F24S 2023/878; F24S 23/31; F24S 23/83; F24S 23/77; F24S 10/45; F24S 50/20; F24S 20/20; F24S 30/40; G02B 19/0019; G02B 19/0042; G02B 19/008; G02B 19/0028; G02B 5/10; G02B 6/0038;
(Continued)

(56) References Cited

U.S. PATENT DOCUMENTS 3,923,381 A    12/1975   Winston
4,003,638 A *  1/1977   Winston ............... F24S 23/77
                                                    359/852
(Continued)

FOREIGN PATENT DOCUMENTS

WO    2007/026311 A1   3/2007
WO    2010101644 A1    9/2010
(Continued)

*Primary Examiner* — Stephone B Allen
*Assistant Examiner* — Rahman Abdur
(74) *Attorney, Agent, or Firm* — Browdy and Neimark, PLLC

(57) ABSTRACT

An electromagnetic radiation collecting device is presented, which is particularly useful for the collection of solar radiation, providing optimal radiation collection throughout the daytime, and throughout yearly seasonal changes. The collector entails a redundant number of static collectors arranged in such a manner as to provide maximal and chronologically evened collection outline.

21 Claims, 13 Drawing Sheets

(51) Int. Cl.
*F24S 23/79* (2018.01)
*F24S 23/70* (2018.01)
*F24S 50/80* (2018.01)

(52) U.S. Cl.
CPC .......... *F24S 50/80* (2018.05); *G02B 19/0019* (2013.01); *G02B 19/0042* (2013.01); *F24S 2023/83* (2018.05); *F24S 2023/878* (2018.05); *Y02E 10/40* (2013.01)

(58) Field of Classification Search
CPC ....... Y02E 10/40; G01S 3/7861; H02S 40/44; G03F 7/70175; H04L 69/16
USPC ......................................................... 359/853
See application file for complete search history.

(56) References Cited

U.S. PATENT DOCUMENTS

| | | |
|---|---|---|
| 4,047,517 A | 9/1977 | Arnberg |
| 4,309,079 A | 1/1982 | Holland |
| 4,815,444 A | 3/1989 | Holland |
| 6,123,436 A | 9/2000 | Hough et al. |
| 8,184,372 B1 | 5/2012 | Gu |
| 8,350,145 B2 | 1/2013 | Angel |
| 8,546,686 B2 | 10/2013 | Ashkin |
| 8,864,343 B2 | 10/2014 | Inoue |
| 2001/0006066 A1 | 7/2001 | Cherney |
| 2006/0072222 A1 | 4/2006 | Lichy |
| 2010/0269816 A1* | 10/2010 | Polk, Jr. ................ F24S 23/80 126/600 |
| 2011/0193512 A1 | 8/2011 | Singhal et al. |
| 2016/0004055 A1* | 1/2016 | Delsaut ............. G02B 19/0042 359/853 |

FOREIGN PATENT DOCUMENTS

| | | |
|---|---|---|
| WO | 2010107921 A1 | 9/2010 |
| WO | 2016005964 A1 | 1/2016 |

* cited by examiner

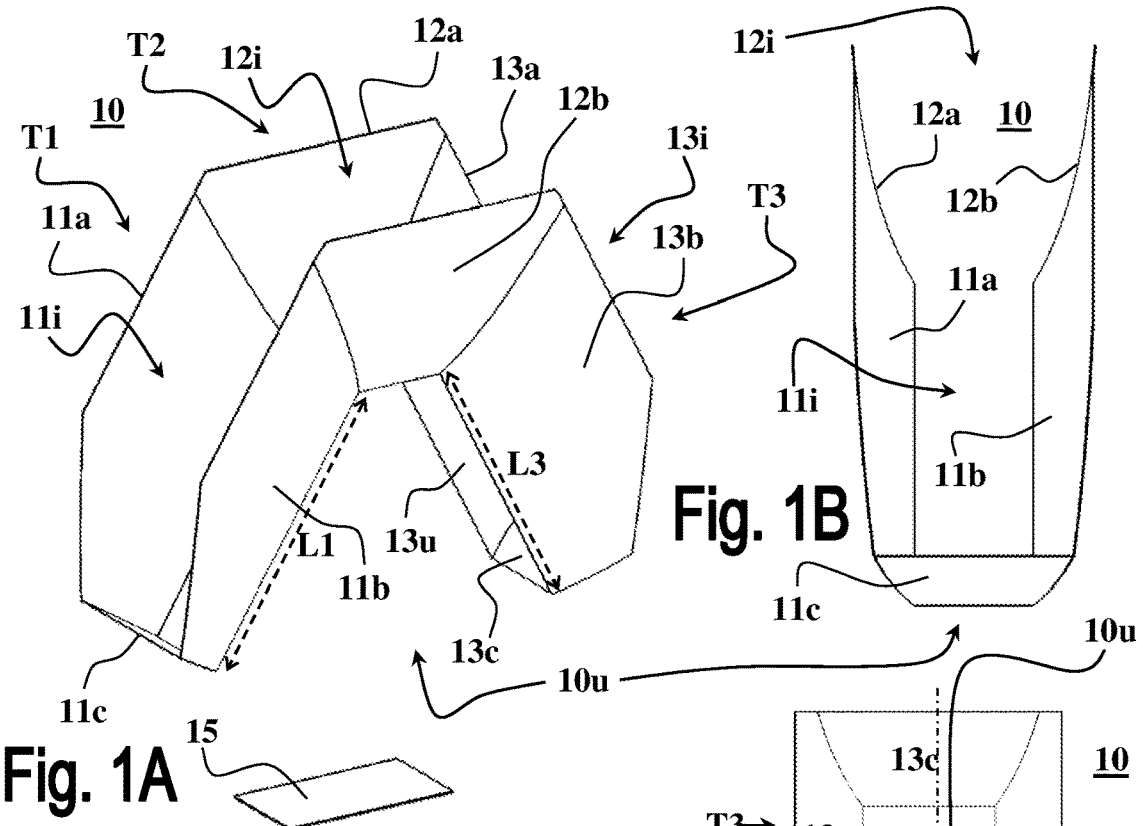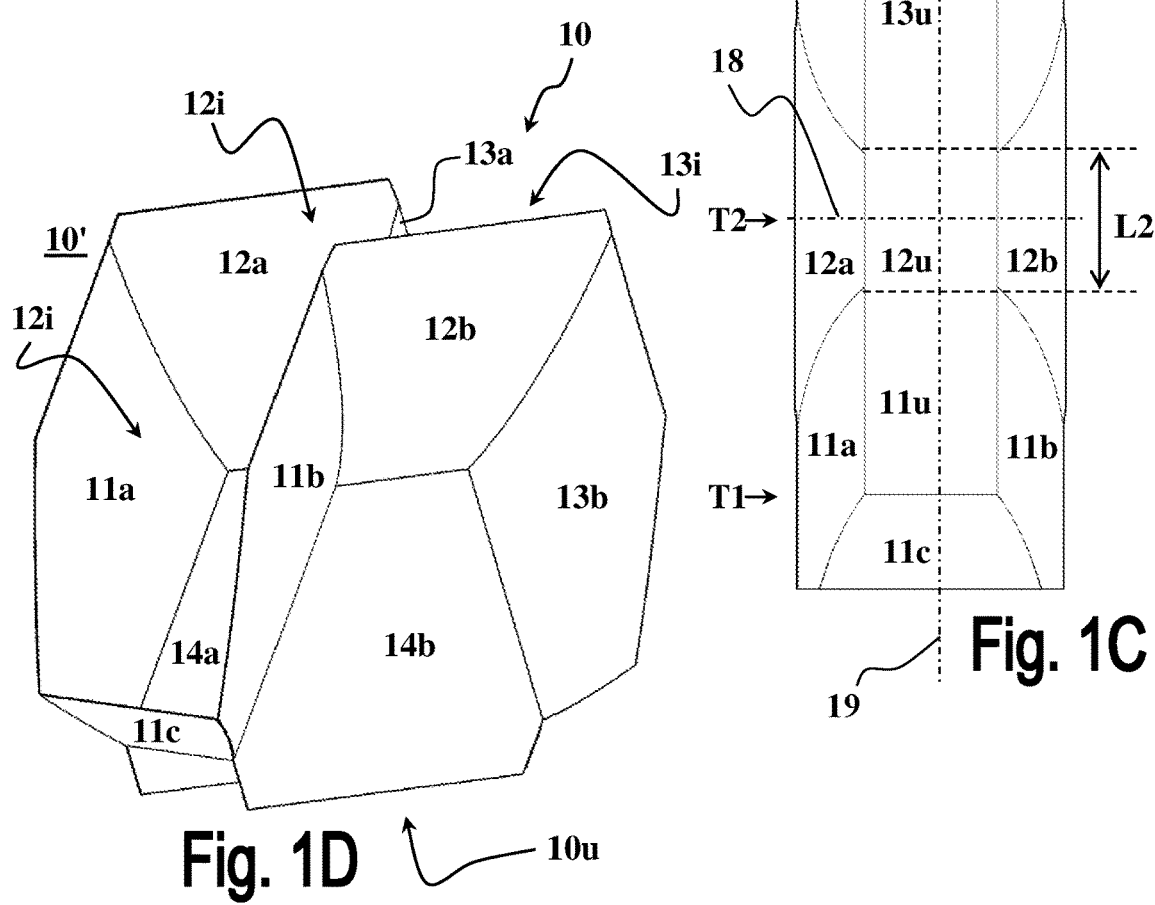

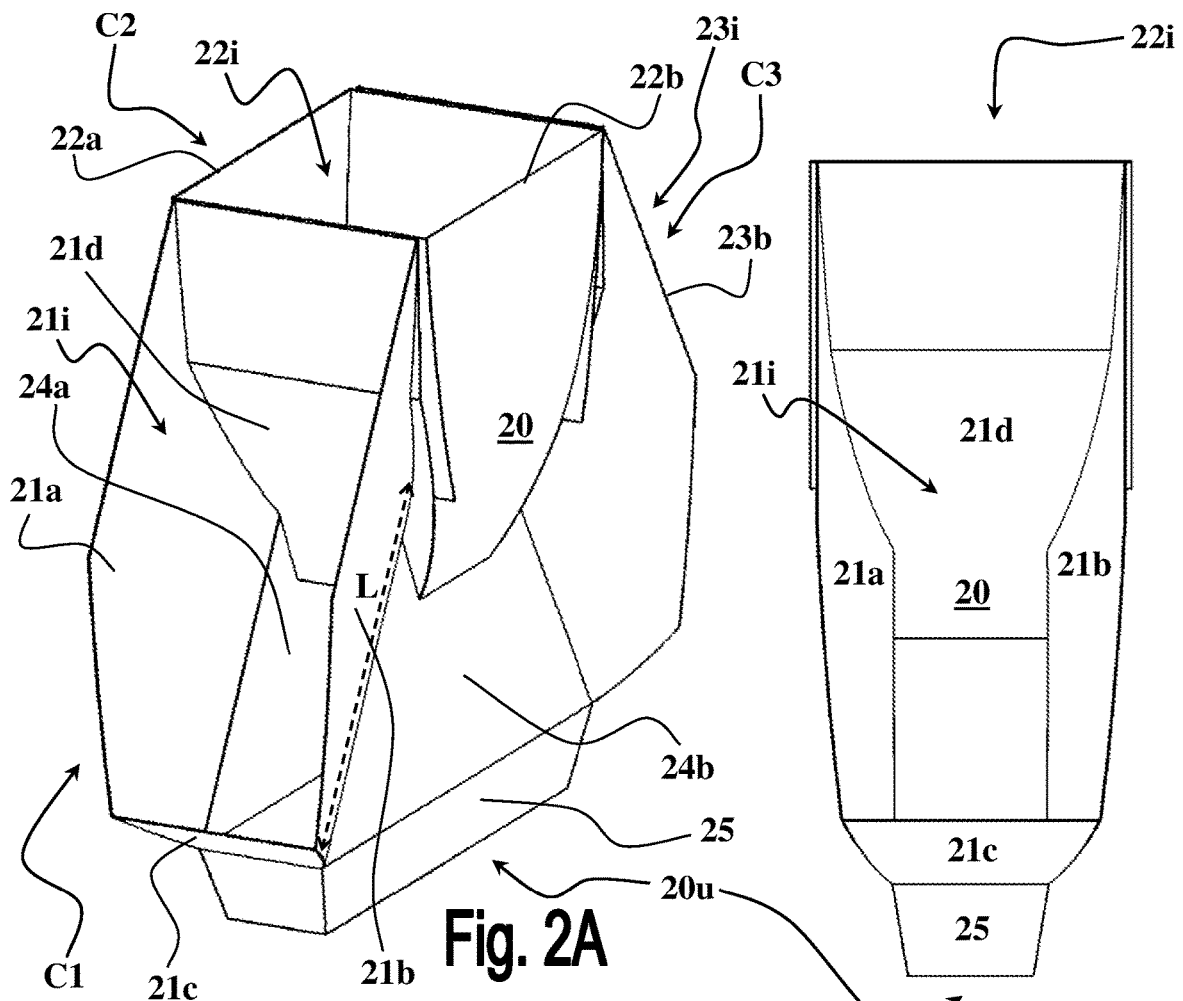
Fig. 2A
Fig. 2B
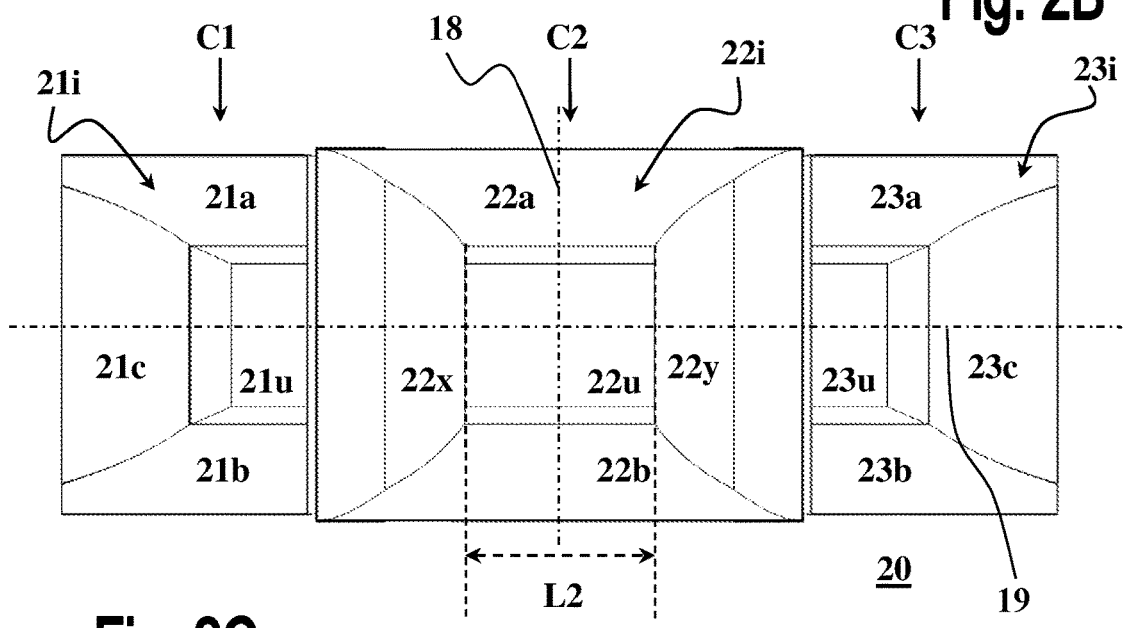
Fig. 2C

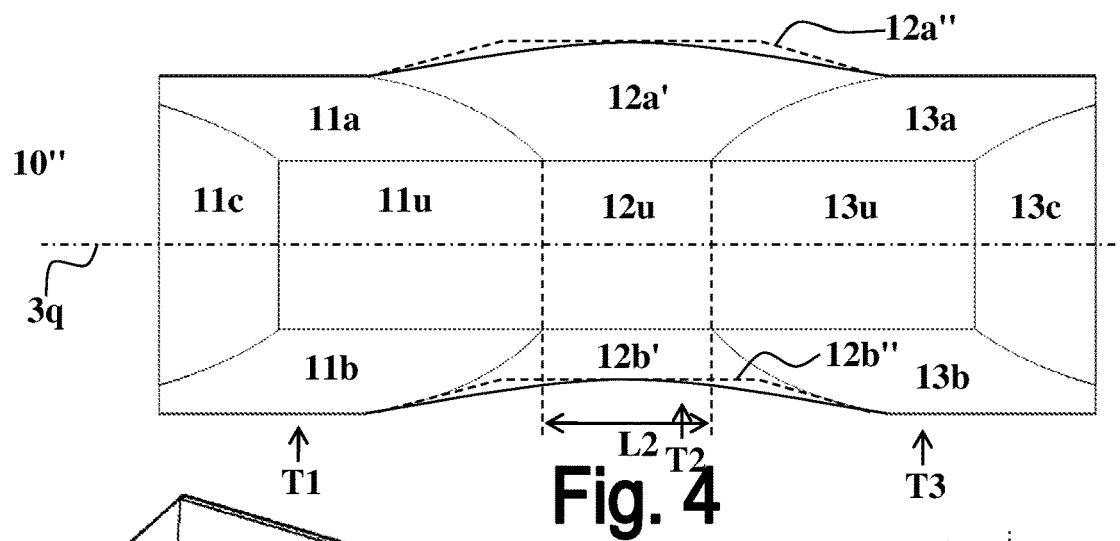
Fig. 4
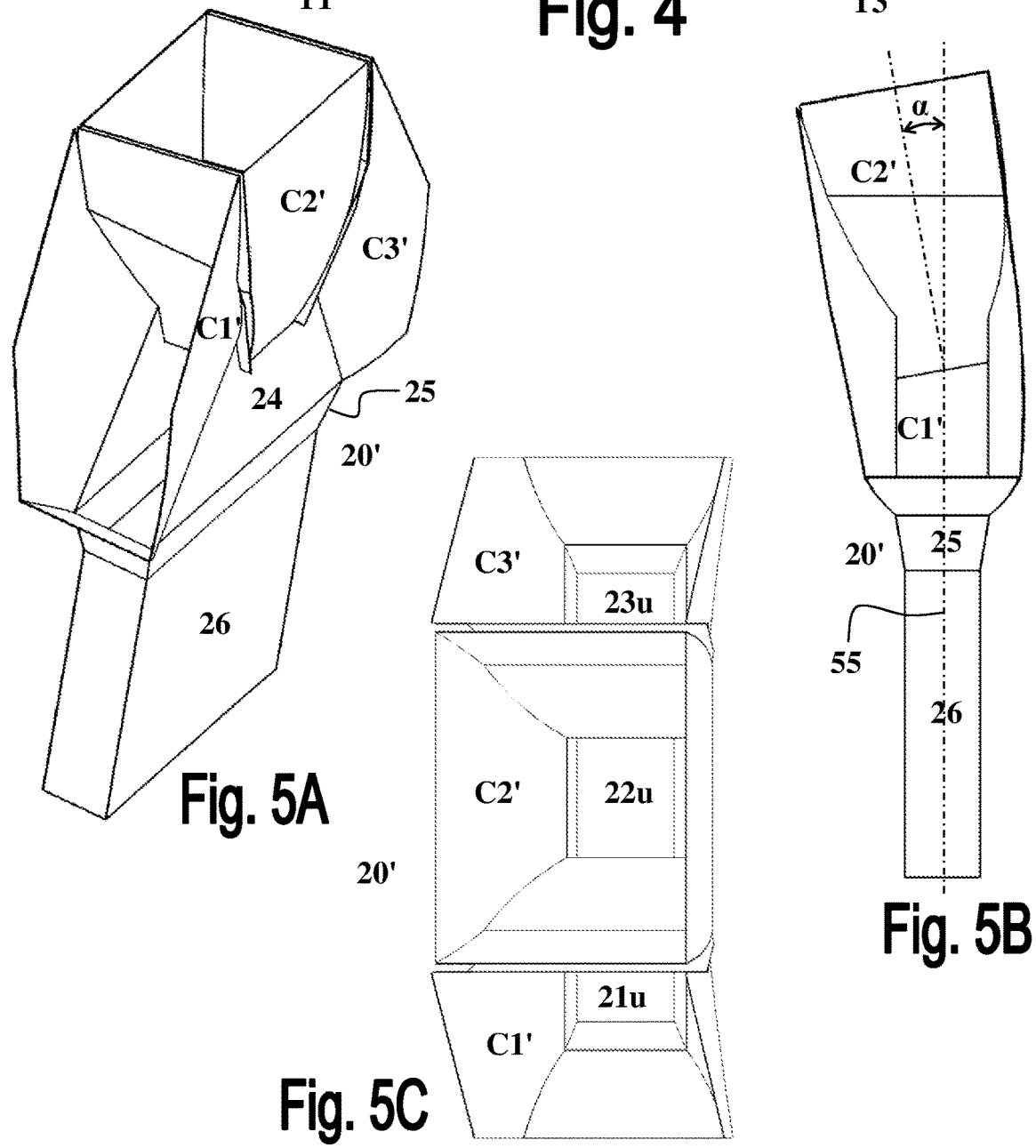
Fig. 5A
Fig. 5B
Fig. 5C

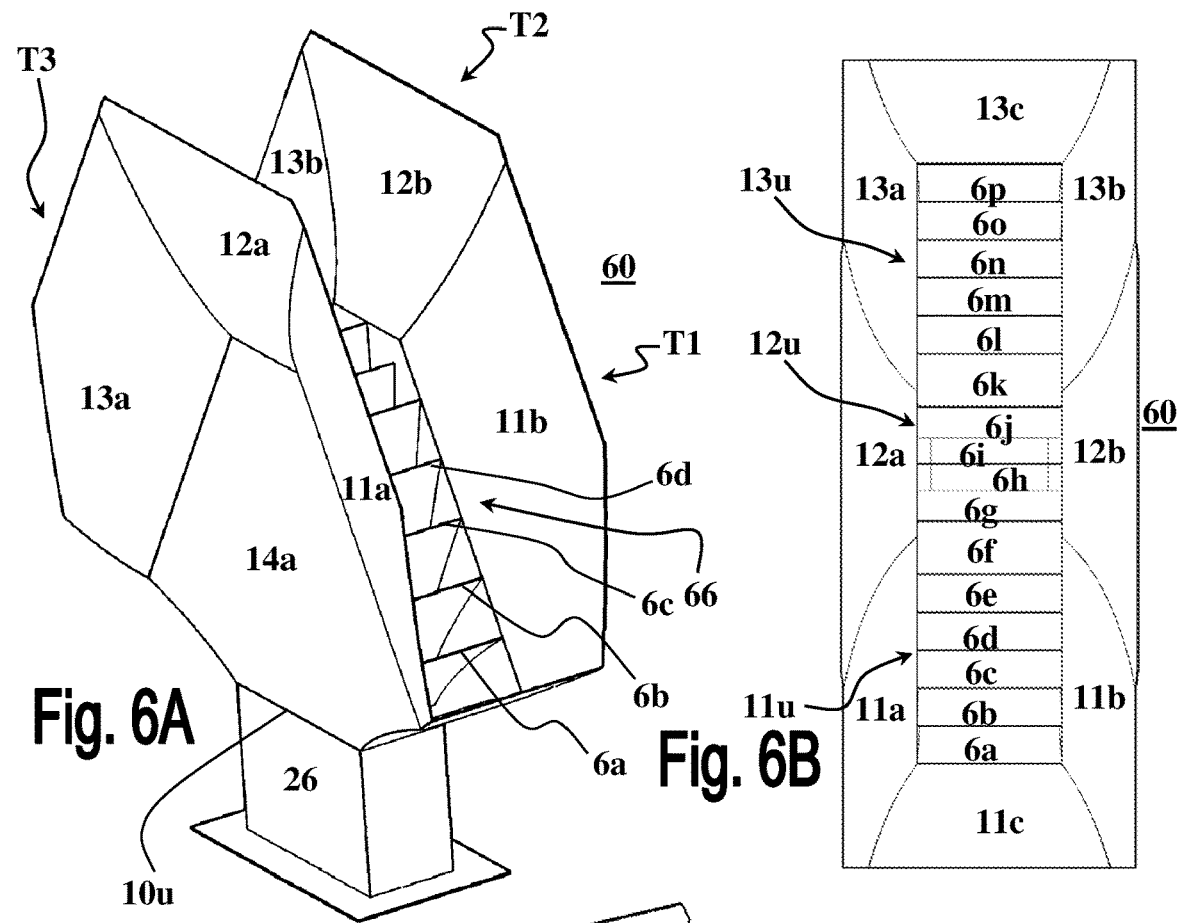
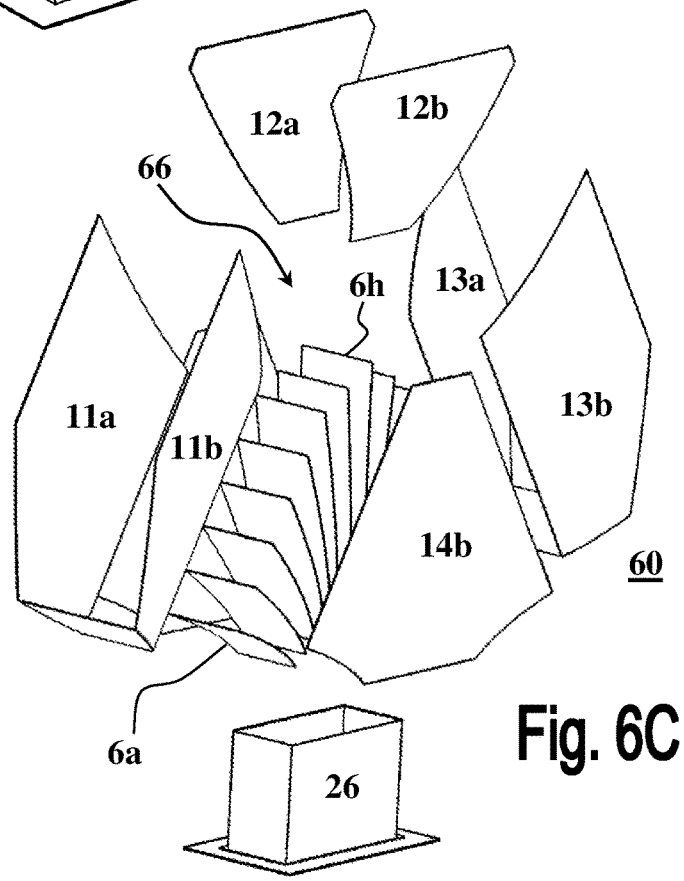

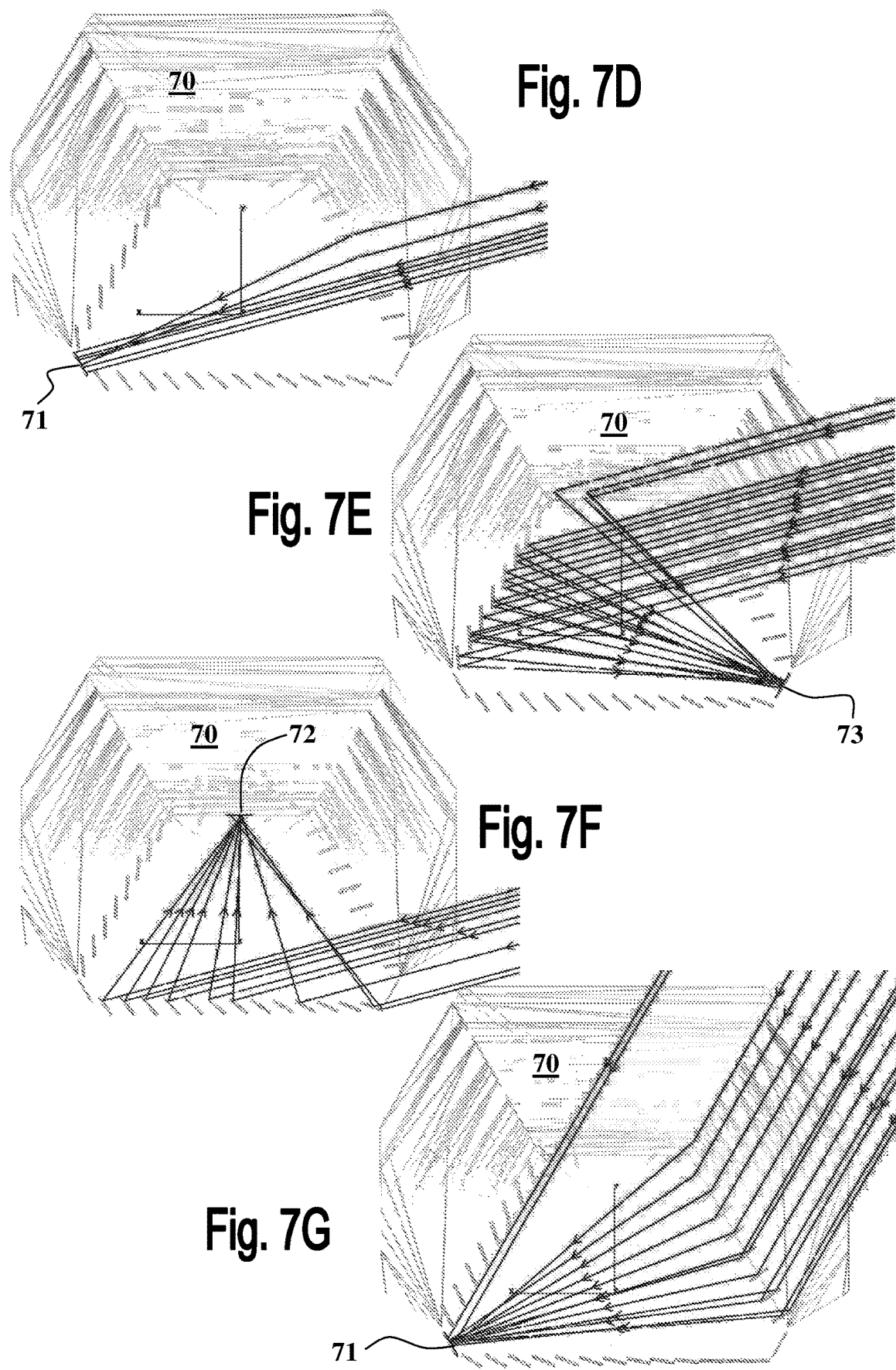

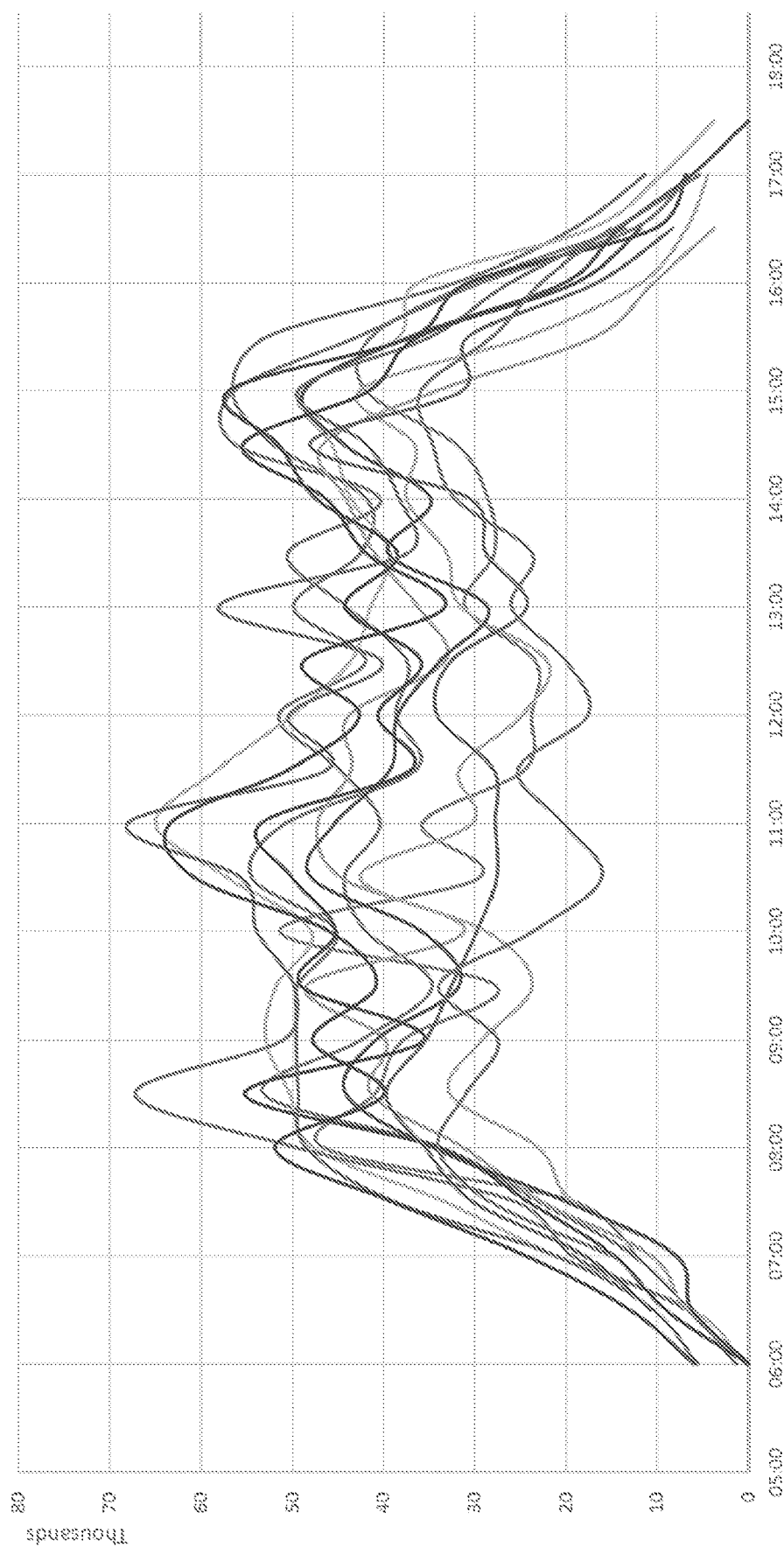

OPTIMIZED STATIC RADIATION COLLECTOR

TECHNOLOGICAL FIELD

The present invention is generally in the field of radiation collectors designed to collect and concentrate incident electromagnetic radiation from a celestial radiation source.

BACKGROUND ART

Non-imaging optics relates to applications that do not require image formation (i.e., no need to concentrate the collected rays to a single point), but rather efficient collection and concentration of electromagnetic radiation (e.g., solar energy conversion, signal detection, illumination optics, and suchlike). Non-imaging optic solutions are developed nowadays for different applications requiring efficient collection of solar radiation, and attract considerable attention in attempts to reduce/replace use of fossil fuels. For example, and without being limiting, passive and active solar heating and/or lighting, hot water production, heat pumps and sorption cooling and refrigeration systems, industrial air and water systems for process heat, desalination, and/or solar chemical systems for thermal power systems.

International patent publication No. WO 2010/101644 describes a radiant energy trap with at least one refractor, reflector and receiver. The angle of acceptance of radiant energy can be flat panel equivalent with a relatively high concentration ratio (CR) of diffuse light. The refractor can be a composite of layers, solid or nested fluid layers. The fluid can be a transparent refractive component and can flow through the refractor as a thermal transfer medium. High solar energy utilization is achieved as a hybrid electric/thermal conversion, diffuse light concentrating solar collector PV cells can be displaced, proportional to the CR, with inexpensive optics. Overall orientation and relative angles of refractor surfaces can be changed to selectively reject a portion of diffuse light to increase CR. Radiant energy can be selectively directed to active PV area from PV cell contact area without reducing the angle of acceptance of ambient radiant energy. The refractor assembly can be arrayed and thermally isolated.

International patent publication No. WO 2007/026311 describes a solar collector comprising a tubular housing which is provided inside the space of the housing with an absorber for absorbing solar radiation across virtually the entire surface of the tubular housing; one or more surfaces reflecting solar radiation for indirectly irradiating the part of said absorber which is located on the shadow side of the tubular housing, at least one of the reflecting surfaces extending up to at least the horizontal tangent on the outermost point of the absorber which is located on the side of the housing on which direct solar radiation impinges; in which the solar collector is characterized in that the surfaces reflecting the solar radiation and the absorber are designed such that all solar radiation incident at right angles impinges on the absorber, on the one hand directly and on the other hand by reflection on the reflecting surfaces, in such a manner that the sine of the angle of incidence of said radiation on the absorber is substantially equal to 1.

US patent publication 2001/006066 describes a solar collection system and method having means for receiving solar radiation through a main refractive interface and means for internally reflecting at least once, at least a portion of the received solar radiation. The refractive medium may be liquid, gel or solid. The device may be integrated with a photovoltaic device, photohydrolytic device, a heat engine, a light pipe or a photothermal receptor.

U.S. Pat. No. 4,815,444 describes a solar concentrator trough of wide-angle capability disposed east-west lengthwise in an inverted V shape. The legs of the inverter V include an angle of less than 180 degrees as measured on the underside of the trough. The trough leans at an appropriate angle toward a path of solar traverse so as to function for any desired fraction of the year without adjustment. Heated liquid rises to the high point in the concentrator's absorber conduit and flows by conduit to a reservoir. Higher temperature performance is achieved in part by making minimal adjustments to the angle of lean.

WO 2010/107921 describes a solar energy collector system including a base, and a parabolic trough collector carried by the base for reflecting sunlight to a longitudinal focal line. The parabolic trough collector includes a center section horizontally positioned with respect to ground, and opposing end sections adjacent the center section. Each end section is angled towards the ground. A conduit is positioned along the longitudinal focal line to receive the reflected sunlight. The conduit circulates a heat transfer liquid therethrough to be heated by the reflected sunlight.

GENERAL DESCRIPTION

Types of trough-shaped radiation (CPC—compound parabolic concentrator) collectors are commonly used in many applications to collect solar energy e.g., for heating, lighting, and/or generating electricity. In certain conditions these types of collectors can maximize the solar energy collection, however, they cannot provide uniform collection profiles and thus cannot be effectively used in certain applications, such as solar illumination/lighting systems. The present invention provides apparatuses and systems configured to collect electromagnetic radiation emitted from a celestial radiation source and provide improved and substantially uniform radiation collection profiles throughout trajectories of movements of the radiation source in both the horizon-plane and seasonal-plane. Some of the embodiments disclosed herein further provide substantially improved concentration ratios.

In a broad aspect, there is provided an apparatus for collection of electromagnetic radiation emitted from a celestial radiation source and comprised of three trough-shaped radiation collectors. Each radiation collector being configured and oriented to optimize radiation collection of incident radiation arriving from the radiation source within a respective range of incident angles, as typically occurs during the morning, noon (midday) and afternoon, times of the day, and concentrate the collected radiation towards a common target surface of the apparatus. The radiation collectors are arranged such that one of the collectors is disposed between the two other collectors, such that the three collectors share the same plane of symmetry with the lateral collectors being tilted relative to the central collector.

Preferably, the tilt angle of the lateral collectors defines a predetermined obtuse angle between elongated axes of symmetry their exit apertures and the elongated axis of symmetry of the exit aperture of the central collector. In this way, with the lateral collectors having substantially the same length, a substantially isosceles trapezoidal shape of the apparatus is obtained. In this configuration the exit apertures of the three collectors forms a continuous exit aperture also having a substantially isosceles trapezoidal shape/profile. A target surface for collecting the radiation outputted from the exit apertures of the apparatus may be centered between the free ends of the lateral collectors, substantially in parallel to the exit aperture of the central collector. Optionally, the target surface is vertically lowered to a position located below the apparatus.

Optionally, and in some embodiments preferably, the apparatus comprises two guiding panels extending from the exit apertures of the collectors towards the target surface and/or an exit aperture of the apparatus. The internal surfaces of the guiding surfaces are reflective and they are configured to enclose the radiation outputted from the exit apertures of the collectors and direct it towards the target surface and/or the exit aperture of the apparatus.

In some embodiments the apparatus is implemented by three two-dimensional trough-shaped radiation collectors e.g., using parabolic reflectors, circular reflectors, dish-shaped reflectors, elliptical reflectors, hyperbolic reflectors, spherical reflector, or any combination thereof. In this case, a side reflector is mounted at the free end of each lateral collector substantially perpendicular to its reflectors and to its exit aperture.

Alternatively, the apparatus is implemented by three three-dimensional radiation collectors e.g., rectangular funnel-shaped collectors. For example, in possible embodiments the central collector is made of a pair of coaxial CPC collector, such that reflectors of one of the CPC collectors are substantially perpendicular to the reflectors of the other CPC collector, and the CPC collectors share the same exit aperture, and each lateral collector comprises a CPC collector having the side reflector at its free end and a trap reflector at its other end (i.e., adjacent the central collector) configured to trap incident radiation arriving at angles parallel, or nearly parallel to the ground surface.

In order to prevent flux losses at northern or southern latitudes central reflective surfaces of the collectors are elevated relative to the horizon plane. In this way the coverage of the apparatus is adapted to encompass larger vertical movements of the radiation source in the seasonal-plane and maintain substantial uniform radiation collection profiles throughout the different seasons of the year. For example, if three-dimensional collectors are used in the apparatus, the central collector is tilted to provide the required elevation of the central reflective surfaces. Optionally, upper reflective surfaces of the lateral collectors are curved towards the reflective surfaces of the central collector, to preserve uniformity of the apparatus surfaces and of its radiation collection profiles.

In some embodiments the guiding panels comprise a plurality of parabolic ribs mounted between, and in parallel to, them. Each parabolic rib comprises reflective surfaces on both sides thereof, and one end thereof is located adjacent an exit aperture of one of the collectors and its other end extend towards the target surface and/or exit aperture of the apparatus. In this configuration a radiation guiding path is formed between each pair of adjacently located parabolic ribs, which forms a manifold of radiation guiding paths gradually coinciding towards the target surface and/or the exit aperture of the apparatus, thereby significantly increasing its concentration ratio.

In some embodiments an array of rotatable mirrors is mounted along the exit aperture of each of the central and lateral collectors. The mirrors may be two sided mirrors. The rotatable mirrors being configured to direct radiation outputted from the exit aperture towards at least one target surface of the apparatus. In some embodiments the apparatus comprises two target surfaces, each being located adjacent a free end of a respective lateral collector and configured to face the mirrors of the other lateral collector and of the central collector. In some embodiments the apparatus comprises an additional target surface located adjacent to the exit aperture of the central collector and substantially centered thereabout, and an additional array of rotatable mirrors arranged in a base section of the apparatus extending underneath the free ends of the lateral collectors and configured to direct radiation outputted from the exit apertures towards the additional target surface.

One inventive aspect of the subject matter disclosed herein relates to an apparatus for collection of incident radiation emitted from a moving radiation source. The apparatus comprises a central two-dimensional trough-shaped (e.g., CPC) radiation collector and two lateral two-dimensional trough-shaped (e.g., CPC) radiation collectors, where the lateral and central collectors have a same plane of symmetry, and each one of the lateral collectors extends from a respective end side of the central collector with a predetermined tilt angle defining an obtuse angle (e.g., about 100° to 150°) between elongated symmetry axes of exit apertures of the central and lateral collector. Optionally, and in some embodiment preferably, central reflective surfaces of the apparatus are asymmetrically displaced relative to the symmetry plane within a predefined displacement angle relative to said plane and determined according to a trajectory of the radiation source.

Optionally, and in some embodiment preferably, exit apertures of the lateral two-dimensional collectors are of a same length such that a substantially isosceles trapezoidal shape of the apparatus is obtained and radiation outputted through the exit apertures of the lateral and central collectors is directed towards a target surface located below said central collectors and being substantially parallel to its exit aperture.

One or more guiding elements can be used for guiding the radiation from the target surface to one or more remote location.

Optionally, and in some embodiment preferably, reflectors of the central two-dimensional collector are substantially of isosceles trapezoidal shape. In this configuration entrance aperture of the central collector is formed by the major bases of the reflectors and its exit aperture is formed by minor bases of the reflectors. Optionally, a ratio of the lengths of the exit aperture of the central collector and of each exit aperture of the lateral collectors is about 1:1 to 1:3.

In some embodiment the apparatus comprises two overlapping guiding panels extending from the exit apertures of the two-dimensional collectors and configured for enclosing the radiation outputted from the exit apertures between them. The inner sides of the panels have reflective surfaces facing each other for guiding the collected radiation towards the target surface or an exit aperture of the apparatus. Optionally, a plurality of parabolic ribs are mounted between the guiding panels and substantially parallel to them, where two side surfaces of each parabolic rib being reflective, and each rib having one end thereof located adjacent to one of the exit apertures of the two-dimensional collectors and its other end extending towards an exit aperture of the apparatus.

Each lateral collector can comprise a side reflector mounted at its free end substantially perpendicular to the reflective surfaces of said lateral collector and to its exit aperture. Optionally, and in some embodiments preferably, each lateral two-dimensional collector comprises a trap reflector mounted adjacent to the central collector substantially perpendicular to reflective surfaces of the lateral collector and in a predetermined angle with respect to its exit aperture. In some embodiments the apparatus comprises an additional two-dimensional trough-shaped collector coaxially enclosed inside the central two-dimensional collector and substantially perpendicular thereto.

In some applications an array of rotatable mirrors is mounted in the exit aperture of each two-dimensional collector. Axis of rotation of each rotatable mirror being substantially perpendicular to the elongated axis of symmetry of the exit aperture in which it is mounted, and each of the mirrors configured at a specific angle to direct radiation outputted from its respective exit aperture onto at least one target surface. For example, the apparatus can comprise two target surfaces, each position near a free end of one of the lateral collectors and facing the exit apertures of the central collector and of the other lateral collector.

In some embodiments the apparatus comprises a target surface positioned adjacent and substantially parallel to the central collector, and an additional array of rotatable mirrors located in a base section of the apparatus extending underneath the free ends of the lateral collectors, the mirrors of the additional array being substantially parallel to the mirrors of the other array and configured to receive radiation outputted from the exit apertures and direct it to the target surface.

Optionally, and in some embodiments preferably, the rotary movement of the mirrors can be controllably operable to direct the radiation onto a specific target selected according to a direction of arrival of the incident radiation from the radiation source.

Another inventive aspect of the subject matter disclosed herein relates to an apparatus for collection of incident radiation emitted from a moving radiation source, comprising a central three-dimensional rectangular funnel-shaped radiation collector and two lateral three-dimensional rectangular funnel-shaped radiation collectors, where the lateral and central collectors have a same plane of symmetry and each one of the lateral collectors extends from a respective end side of the central collector with a predetermined tilt angle defining an obtuse angle between elongated symmetry axes of exit apertures of said central and lateral collector. Optionally, and in some embodiments preferably, the central collector is tilted a predetermined tilt angle relative to the plane of symmetry.

Yet another inventive aspect of the subject matter disclosed herein relates to an apparatus for collection of incident radiation emitted from a moving radiation source, comprising a central funnel-shaped radiation collector, two lateral funnel-shaped radiation collectors, the lateral and central collectors having a same plane of symmetry, and each one of said lateral collectors extends from a respective end side of the central collector with a predetermined tilt angle defining an obtuse angle between elongated symmetry axes of exit apertures of the central and lateral collector, and a concentrating structure comprising a plurality of parabolic ribs, each rib reflective surfaces at both sides thereof where an upper end thereof is located adjacent one of the exit apertures, and a lower end thereof is located adjacent a target surface or an exit aperture of the apparatus.

Still yet another inventive aspect of the subject matter disclosed herein relates to an apparatus for collection of incident radiation emitted from a moving radiation source, comprising a central funnel-shaped radiation collector, two lateral funnel-shaped radiation collectors, the lateral and central collectors having a same plane of symmetry, and each one of the lateral collectors extends from a respective end side of said central collector with a predetermined tilt angle defining an obtuse angle between elongated symmetry axes of exit apertures of the central and lateral collector, and an array of rotatable mirrors mounted in the exit apertures of the lateral and central collectors, the mirrors configured to direct radiation outputted through the exit apertures towards at least one target surface of the apparatus. Optionally, and in some embodiments preferably, the apparatus comprises two target surfaces, each located adjacent a free end of a respective lateral collector and facing the mirrors in the central collector and in the other lateral collector.

In some embodiments, the apparatus comprises a target surface positioned adjacent and substantially parallel to the central collector, and an additional array of rotatable mirrors located in a base section of the apparatus extending underneath the free ends of the lateral collectors, the mirrors of the additional array being substantially parallel to the mirrors of the other array and configured to receive radiation outputted from the exit apertures and direct it to the target surface.

Still yet another inventive aspect of the subject matter disclosed herein relates to a system for collecting radiation from a celestial radiation source, comprising a light collection apparatus as described hereinabove or hereinbelow, a light guiding support for mounting the apparatus thereon, receiving light collected by the apparatus and deliver it towards a target location, where the light guiding support configured to set the apparatus mounted thereon in a defined orientation required for optimal radiation collection by the device at a certain latitude.

Still yet another inventive aspect of the subject matter disclosed herein relates to a system for collecting radiation from a celestial radiation source, comprising a light collection apparatus having rotatable mirrors as described hereinabove or hereinbelow, actuating means (e.g., one or more electric motors) configured to controllably affect rotary movement of the rotatable mirrors, and a control unit configured and operable to control operation of the actuating means and set orientation of at least some of the mirrors to direct radiation outputted through the exit apertures of the collectors towards at least one target surface or exit aperture of the apparatus. Optionally, the control unit is configured and operable to select a target surface for the at least some of the mirrors according to an angle of arrival of the radiation from the radiation source.

In some embodiments the system comprise a light guiding support for mounting the apparatus thereon, receiving light collected by the apparatus and deliver it towards a target location, where the light guiding support configured to set the apparatus mounted thereon in a defined orientation required for optimal radiation collection by the device at a certain latitude.

BRIEF DESCRIPTION OF THE DRAWINGS

In order to understand the invention and to see how it may be carried out in practice, embodiments will now be described, by way of non-limiting example only, with reference to the accompanying drawings. Features shown in the drawings are meant to be illustrative of only some embodiments of the invention, unless otherwise implicitly indicated. In the drawings like reference numerals are used to indicate corresponding parts, and in which:

FIGS. 1A to 1D schematically illustrate a radiation collector apparatus according to possible embodiments having a trapezoid profile, wherein FIG. 1A is a perspective view, FIG. 1B is a side view of the apparatus, FIG. 1C is a top view of the apparatus, and FIG. 1D is a perspective view of a modification of the apparatus with guiding panels;

FIGS. 2A to FIG. 2I schematically illustrate a radiation collector apparatus according to possible embodiments having three adjacently located three-dimensional collectors, wherein FIG. 2A is a perspective view of the apparatus, FIG. 2B is a side view of the apparatus, FIG. 2C is a top view of the apparatus, FIG. 2D is an exploded view of the apparatus, and FIGS. 2E to 2I are ray diagrams illustrating radiation collection of the apparatus for various angles of incident radiation;

FIG. 4 is a top view of a radiation collector apparatus as shown in FIGS. 1A to 1D with central surfaces curved/twisted for improved radiation collection at northern/southern latitudes;

FIGS. 5A to 5C schematically illustrate a radiation collector apparatus as shown in FIGS. 2A to 2I with curved/twisted central surfaces for improved radiation collection at northern/southern latitudes;

FIGS. 6A to 6C schematically illustrate a radiation collector apparatus as shown in FIG. 1D having a concentrating structure mounted within its guiding panels, wherein FIG. 6A is a perspective view of the apparatus, FIG. 6B is a top view of the apparatus, and FIG. 6C is an exploded view of the apparatus;

FIGS. 7A to 7L schematically illustrate a radiation collector apparatus as shown in FIG. 1D having a rotating mirrors arrangement at exit apertures thereof, wherein FIG. 7A is a perspective view of the apparatus, FIG. 7B is a top view of the apparatus, FIG. 7C is a sectional view of the apparatus, and FIGS. 7D to 7L are ray diagrams showing various radiation collection schemes;

FIGS. 10A and 10B show annual radiation collection plots at latitude 33° as obtained by computer simulation for the radiation collector apparatuses shown in FIGS. 2A-2I and FIGS. 5A-5C, respectively.

DETAILED DESCRIPTION OF EMBODIMENTS

Figure 2D:
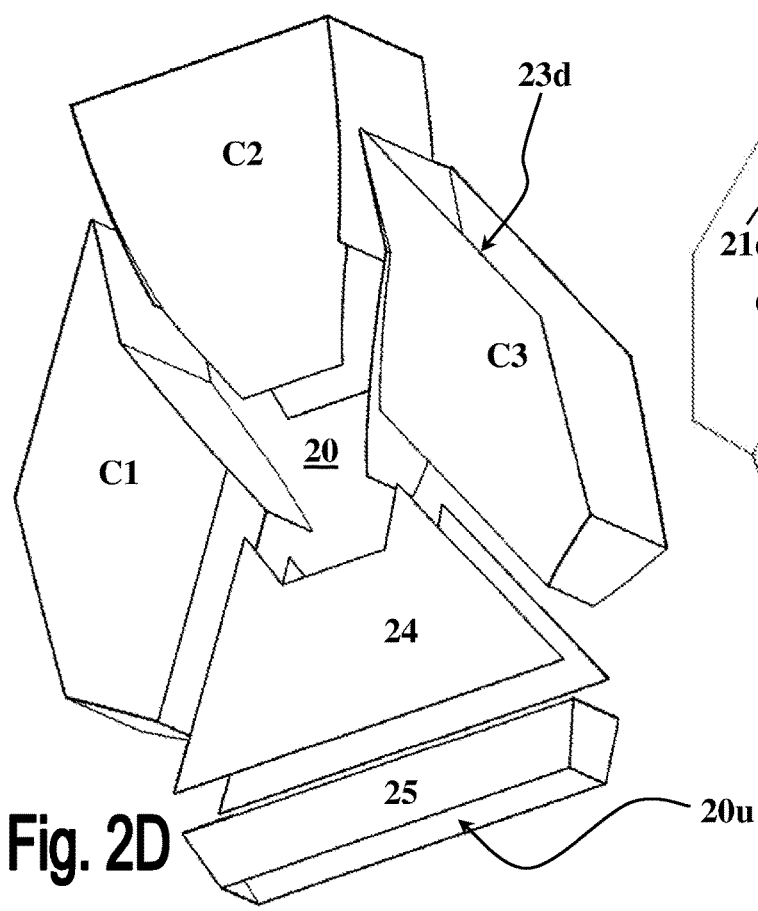

One or more specific embodiments of the present disclosure will be described below with reference to the drawings, which are to be considered in all aspects as illustrative only and not restrictive in any manner. In an effort to provide a concise description of these embodiments, not all features of an actual implementation are described in the specification. Elements illustrated in the drawings are not necessarily to scale, emphasis instead being placed upon clearly illustrating the principles of the invention. This invention may be provided in other specific forms and embodiments without departing from the essential characteristics described herein.

The present invention devise static radiation collectors designed to provide substantially uniform collection profiles of radiation emitted from a celestial radiation source throughout the planet orbit thereabout, at different latitudes on the surface of the planet, and with improved concentration ratios. Particularly, the static radiation collectors of the present invention are designed to provide substantial uniform collection of sun light during the different seasons of the year by adjusting geometries of reflective surfaces thereof in the seasonal (North-South) and horizon (East-West) planes of the sun.

FIGS. 1A to 1D schematically illustrate a radiation collector apparatus 10 according to some possible embodiments. The radiation collector apparatus 10 is comprised of three trough-shaped two-dimensional collectors T1, T2 and T3. The long axes of the three collectors, T1, T2 and T3, are aligned in the horizon plane (19), and the collectors share the same plane of symmetry 19. As seen, the apparatus 10 is symmetric about the plane of symmetry 18. The central collector T2 is substantially parallel to the ground surface (15) to provide optimal radiation collection during midday (11~13), and the lateral collectors, T1 and T3, are tilted downwardly relative to the central collector T2 in a predetermined tilt angle to provide optimal radiation collection during the morning (08~10) and the afternoon (14~16), respectively.

Each of the lateral collectors, T1 and T3, comprises a side reflector, 11c and 13c, respectively, at its free end i.e., at the extremities of the apparatus. The side reflector, 11c and 13c, are configured to collect light at certain angles of the celestial source relative to the respective lateral collector, and thus typically not trapped by the collectors, T1, T2 and T3. In this way, additional light rays can be collected by the collector apparatus 10.

The trough shaped collector T1 comprises two reflectors, 11a and 11b, symmetric about the horizon plane, and positioned such that their reflective surfaces are facing each other. The upper edges of the symmetric reflectors 11a and 11b form an entrance aperture 11i of the collector T1, and their lower edges form an exit aperture 11u of the collector T1. Similarly, the trough shaped collector T2 comprises two reflectors, 12a and 12b, symmetric about the horizon plane, and positioned such that their reflective surfaces are facing each other, where the upper edges of the symmetric reflectors 12a and 12b form an entrance aperture 12i of the collector T2, and their lower edges form an exit aperture 12u of the collector T2. And the trough shaped collector T3 comprises two reflectors, 13a and 13b, symmetric about the horizon plane, and positioned such that their reflective surfaces are facing each other, where the upper edges of the symmetric reflectors 13a and 13b form an entrance aperture 13i of the collector T3, and their lower edges form an exit aperture 13u of the collector T2.

The reflectors of the symmetric reflector pairs 11a-11b, 12a-12b and 13a-13b, preferably have curved/concaved surfaces (e.g., using parabolic reflectors, circular reflectors, dish-shaped reflectors, elliptical reflectors, hyperbolic reflectors, spherical reflector, or any combination thereof). Optionally, and in some embodiments preferably, each pair of symmetric reflectors 11a-11b, 12a-12b and 13a-13b, is configured to form a compound parabolic concentrator (CPC). Optionally, the symmetric reflectors 11a-11b, 12a-12b and 13a-13b, are configured to provide uniform radiation collection profile throughout the trajectory of the radiation source (i.e., in the horizon plane), as described in Israeli patent application filed on Dec. 14, 2015, and incorporated herein by reference.

The symmetric reflectors 12a and 12b of the central collector T2 have a substantially isosceles trapezoidal shape for connection of the lateral collectors, T1 and T3, to the central collector T2 at the desired tilt angle (e.g., in range of 135° to 150° relative to the exit aperture of the central collector). As seen, the major bases of the trapezoidal-shaped symmetric reflectors 12a and 12b form the entrance aperture 12i of the central collector T2, and their minor bases form the exit aperture of the central collector T2. This configuration provides the radiation collector apparatus 10 a substantially isosceles trapezoidal profile. As also seen, the upper corners of the symmetric reflector pairs 11a-11b and 13a-13b, of the lateral collectors T1 and T3, are truncated at their free ends, which has a minor effect on light collection properties of the apparatus, while allowing a tighter packing of several collectors in multiple collector configurations.

As seen in FIG. 1A, showing a perspective view of the radiation collector apparatus 10, the exit apertures, 11u, 12u and 13u, of the collectors, T1, T2 and T3, respectively, forms a substantially isosceles trapezoidal exit aperture 10u of the apparatus 10. The collectors T1, T2 and T3, are configured to collect the incident sunlight trapped at the entrance apertures, 11i, 12i and 13i, respectively, and concentrate it through the exit apertures 11u, 12u and 13u, respectively, onto a target surface 15 being substantially parallel to the ground surface.

In order to obtain substantial uniform collection profile throughout the trajectory of the sun, the lengths L1, L2 (shown in FIG. 1C) and L3, of the exit apertures 11u, 12u and 13u, respectively, in the horizon plane should be properly set. While the lengths, L1 and L3, of the lateral exit apertures, 11u and 13u, are substantially equal (L1=L3=L), the central exit aperture 12u has a substantially smaller length since the intensity of the incident sunlight collected by the central collector T2 during the midday time is substantially higher than the incident sunlight collected by the lateral collectors T1 and T3, during the morning and afternoon times, respectively. In some embodiments the ratio L2/L (between lengths of central exit aperture and any of the lateral exit apertures) is set to about 1:1 to 1:3.

FIG. 1D is a perspective view of a radiation collector apparatus 10' being a modification of the radiation collector 10 shown in FIGS. 1A to 1C, and comprising two guiding panels 14a and 14b, configured to extend from the exit aperture 10u of the apparatus 10 and enclose the concentrated radiation outputted therethrough. The guiding panels 14a and 14b are substantially flat elements, each having a generally isosceles trapezoidal shape, and an inner reflective surface thereby enclosing the radiation outputted from the exit apertures of the collectors and directing it towards a target surface and/or an exit aperture of the apparatus 10'.

FIGS. 2A to FIG. 2D schematically illustrate a radiation collector apparatus 20 according to possible embodiments. The radiation collector apparatus 20 is designed to improve the radiation collection capabilities of the apparatus 10 shown in FIGS. 1A to 1C, by introducing additional reflecting surfaces into the lateral and central collectors. With this configuration three adjacently located three-dimensional collectors, C1, C2 and C3, are obtained. The central three-dimensional collector C2 is set with its entrance aperture 22i substantially parallel to the ground surface, to optimize radiation collection during the midday time, and the lateral three-dimensional collectors, C1 and C3, are extending from the central three-dimensional collector C2 in sideway directions, and their entrance apertures, 21i and 23i, are tilted downwardly in a predefined tilt angle (e.g., in range of 150° relative to the entrance aperture of the central collector, according to the solar angle at start and end of the desired collection period), to optimize radiation collection during the morning and afternoon times, respectively.

Each of the three-dimensional collectors C1, C2 and C3, has a generally rectangular funnel-shape configuration tapering from the entrance aperture towards the exit aperture.

The three-dimensional collector C1 comprises a trough shaped two-dimensional collector formed by the pair of symmetric reflectors 21a and 21b positioned in the horizon plane, and an additional trough shaped two dimensional collector formed by the side reflector 21c located at its free end and the trap reflector 21d abutting to the central three-dimensional collector C2. While the geometry of the pair of symmetric reflectors 21a-21b is substantially the same as the pair of symmetric reflectors 11a-11b described hereinabove with reference to FIGS. 1A to 1D, the side reflector 21c and the trap reflector 21d form a two dimensional collector which is not necessarily symmetric, and its main purpose is to capture incident light during the early morning time (i.e., to capture light rays that are parallel, or nearly parallel to the ground surface).

Similarly, the three-dimensional collector C3 comprises a trough shaped two-dimensional collector formed by the pair of symmetric reflectors 23a and 23b positioned in the horizon plane, and an additional trough shaped two dimensional collector formed by the side reflector 23c located at its free end and the trap reflector 23d abutting to the central three-dimensional collector C2. The geometry of the pair of symmetric reflectors 23a-23b is substantially the same as the pair of symmetric reflectors 13a-13b described hereinabove with reference to FIGS. 1A to 1D, and the side reflector 23c and the trap reflector 23d form a two dimensional collector which is not necessarily symmetric, and its main purpose is to capture incident light during the late afternoon time (i.e., light rays that are parallel, or nearly parallel to the ground surface).

Optionally, and in some embodiments preferably, the pairs of symmetric reflectors 21a-21b and 23a-23b are each configured to from a CPC, as described hereinabove, while the pairs of side and trap reflectors 21c-21d and 23c-23d are implemented by substantially flat surfaces oriented to form two dimensional collector structure tapering from their entrance apertures, 21i and 23i, towards their exit apertures 21u and 23u.

Optionally, and in some embodiment preferably, the central three-dimensional collector C2 is comprised of two pairs of symmetrical two-dimensional CPC collectors, 22a-22b and 22x-22y, configured as described hereinabove, forming a rectangular funnel shape structure.

As in the radiation collector apparatus 10 shown in FIGS. 1A to 1D, the lengths L of the exit apertures 21u and 23u of the three-dimensional collectors C1 and C3, in the horizon plane, are substantially greater than the horizon length L2 of the exit aperture 22u of the three-dimensional collector C2. In some embodiments, the ratio of the aperture horizon-plane-lengths L2/L is set to about 1:1 to 1:3, in order provide substantially uniform radiation collection profile throughout the trajectory of the radiation source. As seen, the apparatus 20 is symmetric about the symmetric planes 18 (a seasonal plane) and 19 (the horizon plane).

In some embodiments the radiation collector apparatus 20 comprises guiding panels 24a and 24b having internal reflective surfaces and extending from the exit apertures 21u, 22u and 23u, towards the free ends of the reflector pairs 21a-21b and 23a-23b, so as to enclose the concentrated radiation outputted through the exit apertures. FIGS. 2A to 2I further exemplify use of rectangular funnel-shaped radiation collector concentrator 25 attached to the guiding panels 24a and 24b for delivering the collected radiation to the light guide 26.

Figure 2E:
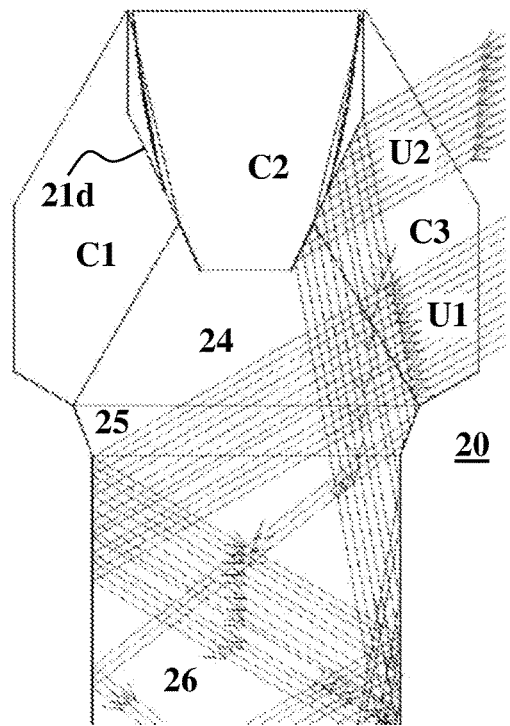

FIGS. 2E to 2I show diagrams illustrating radiation collection of the radiation collection apparatus 20 simulated for different time of the day. FIG. 2E demonstrates the radiation collection during early morning time, around 8:00, and late afternoon time, around 16:00, wherein a portion of the incident radiation U1 is delivered directly by the lateral collector C3 to the light guide 26, and another portion U2 of the incident radiation is delivered by the lateral collector C3 with the aid of the trap reflector 23d. Although this specific example show radiation collection around 16:00, due to the symmetric configuration of the apparatus 20, the same collection pattern is obtained around 8:00 by the lateral collector C1.

Figure 2F:
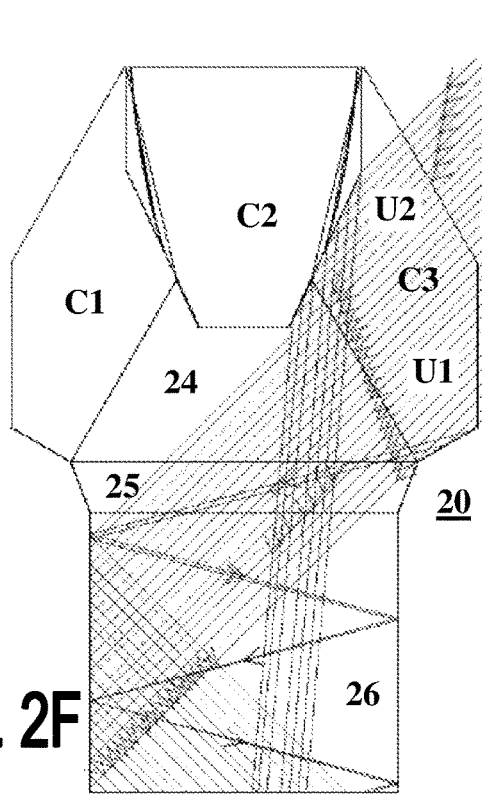
Figure 2G:
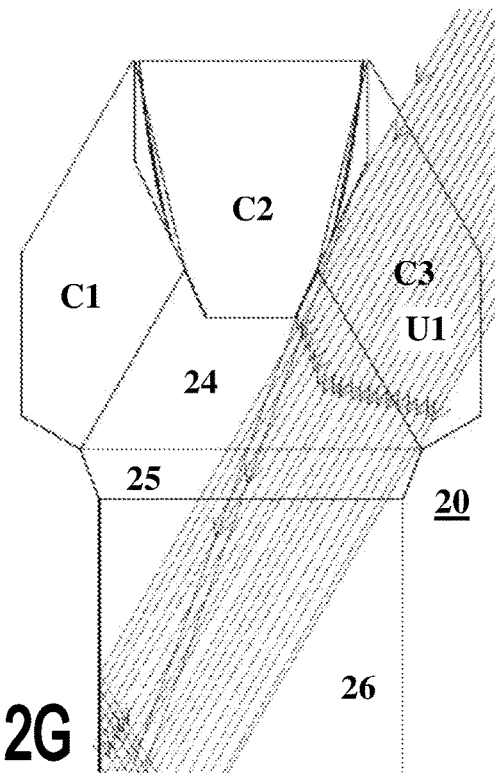

As seen in FIG. 2F, as the location of the radiation source is elevated around 9:00 and 15:00 more incident radiation U1 is delivered directly by the lateral collector C3 (by the collector C1 around 9:00) to the light guide 26. Around 14:00, as shown in FIG. 2G, the altitude of the radiation source is such that substantially all of the incident radiation U1 is delivered directly to the light guide 26 by the lateral collector C3 (by the collector C1 around 10:00), without hitting the trap reflectors 21d/23d.

Figure 2H:
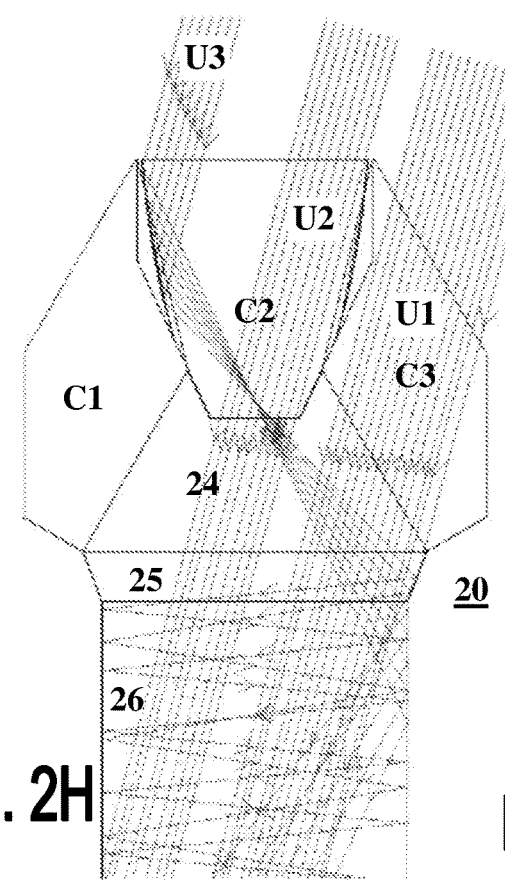

With reference to FIG. 2H, around 13:00 a significant portion of the incident radiation U1 is delivered to the light guide 26 directly by the lateral collector C3, a smaller portion U2 by the central collector C2, without hitting the seasonal-plane reflector 22x, and yet another smaller portion U3 is delivered by the seasonal-plane reflector 22x of the central collector C2. Similarly, around 11:00 (not shown) a significant portion of the incident radiation U1 is delivered to the light guide 26 directly by the lateral collector C1, a smaller portion U2 by the central collector C2, without hitting the seasonal-plane reflector 22y, and yet another smaller portion U3 is delivered by the seasonal-plane reflector 22y of the central collector C2.

Figure 2I:
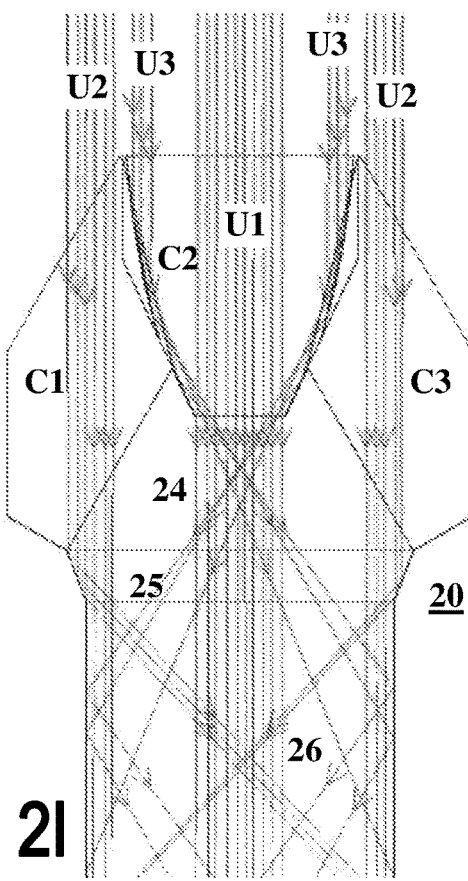

As seen in FIG. 2I, when the radiation source reaches its highest altitude around 12:00, a significant portion of the incident radiation U1 is delivered to the light guide 26 directly by the central collector C2 without hitting the horizon-plane reflectors 22x and 22y, a smaller portion of the incident radiation U2 is delivered to the light guide 26 directly by the lateral collectors C1 and C2, and yet a smaller portion of the incident radiation U3 is delivered by the horizon-plane reflectors 22x and 22y of the central collector C2.

The radiation collector apparatuses shown in FIGS. 1A-D and 2A-I are particularly suitable for equatorial geographical regions characterized by symmetrical seasonal solar movement. In some applications, these embodiments are implemented utilizing modified CPC designs, as described and illustrated in Israeli patent application filed on Dec. 14, 2015, e.g., to provide a daily coverage of 120° (8 hours) and a seasonal coverage of ±25°.

Figure 3:
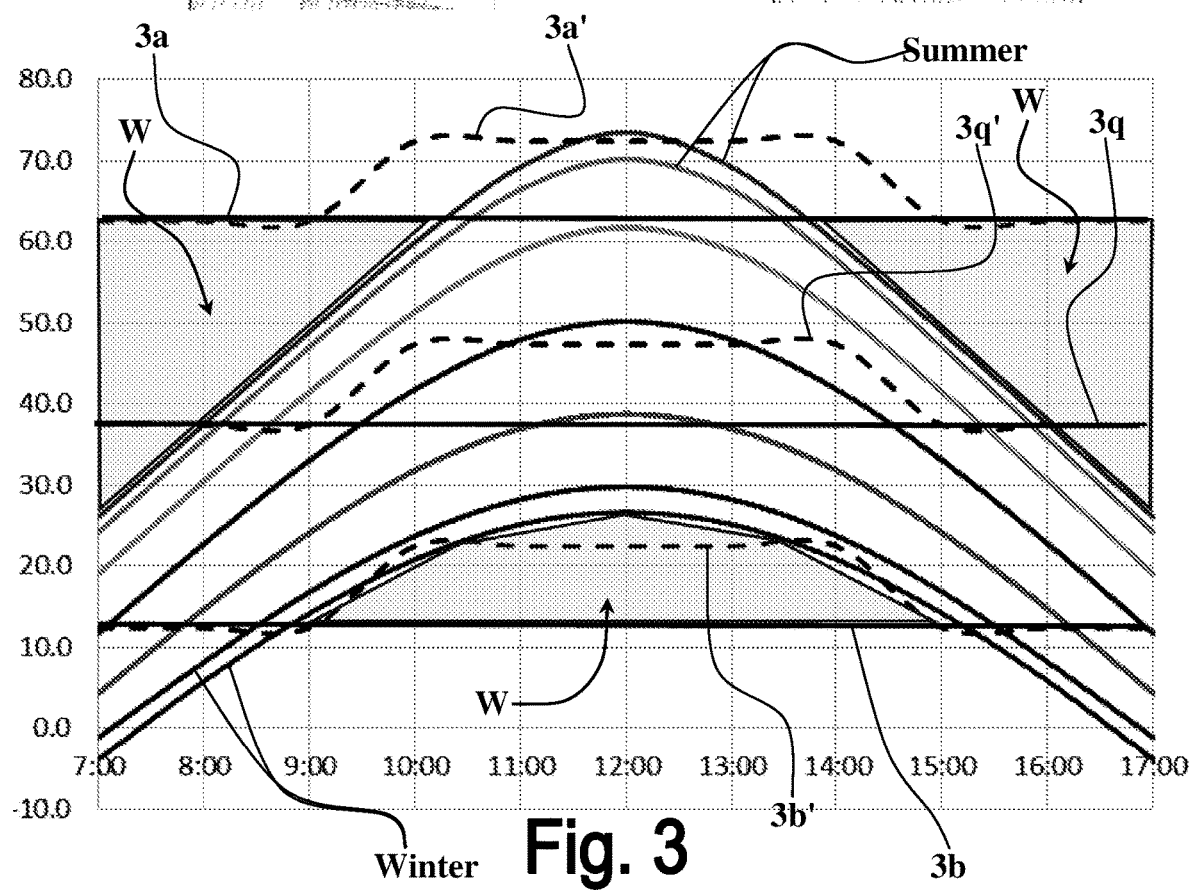
FIG. 3 shows graph plots of annual solar altitude at latitude 40°.

As illustrated in FIG. 3 in more northern (and southern) latitudes the solar movement is not seasonally symmetrical such that during the summer time periods the location of the sun falls outside of the coverage of the radiation collection apparatuses shown in FIGS. 1A-D and 2A-I during the midday times (10:30 to 13:30), and during the early morning (7:00 to 8:30) and late afternoon (15:30-17:00) time during the winter. FIG. 3 shows the annual solar altitude at latitude 40° and the angular acceptance provided by the radiation collection apparatuses shown in FIGS. 1A-D and 2A-I, as indicated by the solid lines 3a and 3b, where the center line 3q is the elongated axis of symmetry of the apparatuses (in the horizon plane). As seen in FIG. 3, the coverage is insufficient, while in some areas W there is wasted coverage.

In order to prevent flux collection losses during midday time periods of the summer months, and wasted coverage during midday time periods of the winter months, in some embodiments central horizon-plane reflective surfaces of the radiation collecting apparatuses are elevated relative to the horizon plane, as indicated by the dashed lines 3a', 3q' and 3b'. In a similar fashion, in some possible embodiment lateral reflecting horizon-plane surfaces of the radiation collecting apparatuses are lowered (not shown) relative to the horizon plane, in order to prevent flux collection losses during early morning and late afternoon times of the summer months, and wasted coverage during early morning and late afternoon times of the winter months. By so curving/twisting the central horizon-plane reflective surfaces area of the radiation collector the angular acceptance of the central section the apparatus is adapted for northern (or southern) latitudes. Apparently different designs may be required at different latitudes according to the tilt angle required.

FIG. 4 is a top view of a radiation collector apparatus 10″ as shown in FIGS. 1A to 1D in which central horizon-plane surfaces 12a' and 12b' of the central collector T2 had been curved/twisted in order to improve the radiation collection profiles at northern (or southern if the apparatus is turned 180° about its central collector) latitudes. As seen, the exit apertures, 11u, 12u and 13u, and their lengths, remain substantially unchanged, and also the heights of the reflectors. In this non-limiting, the horizon-plane reflective surfaces 12a' are elevated relative to the long axis of symmetry 3q to provide substantially smooth curved reflective surfaces 12a' and 12b'. As illustrated by the dashed lines, 12a″ and 12b″, in some possible embodiments the elevation of the horizon-plane central reflective surface is not so smooth, and a substantially isosceles trapezoidal shape is formed by the elevated horizon-plane reflective surfaces.

FIGS. 5A to 5C schematically illustrate a radiation collector apparatus 20' as shown in FIGS. 2A to 2I with curved/twisted central surfaces for improved radiation collection at northern (or southern) latitudes. In this embodiment the central three-dimensional collector C2' is tilted by a degrees relative to symmetry axis 55 (a 10° tilt in this example) i.e., thereby actually curving the axis of symmetry. As exemplified in FIG. 5A-C, the upper edges of the reflective surfaces of the lateral collectors C1' and C3' are also curved/twisted near their connection to the central collector C2', in order to provide substantially uniform/smooth radiation collection profiles during the movements of the radiation source. Accordingly, different tilt angles will be required at different geographical latitudes.

FIGS. 6A to 6C schematically illustrate a radiation collector apparatus 60 having substantially the same structure of the radiation collector 10' shown in FIG. 1D, and further comprising a concentrating structure 66 mounted within its guiding panels, 14a and 14b. The concentrating structure 66 comprises a plurality of parabolic ribs 6a, 6b, 6c, . . . (collectively referred to herein as parabolic ribs 6; in this non-limiting example 16 parabolic ribs are used) each being positioned substantially perpendicular to the guiding panels, 14a and 14b, and having an upper end thereof located at (or adjacent) one of the exit apertures, 11u, 12u and 13u, and a lower end located at (or adjacent) the exit aperture 10u of the apparatus. The two sides of each of the parabolic ribs 6 are reflective to provide total internal reflection of light between each pair of adjacently located parabolic ribs 6.

The concentrating structure 66 thus forms a manifold of parabolic ribs 6 extending from the exit apertures, 11u, 12u and 13u, and extending towards the exit aperture 10u of the apparatus. Adjacently located parabolic ribs 6 are thus adapted to concentrate the collected and concentrated incident light at certain times of the day. The parabolic ribs 6 are configured to receive the concentrated light outputted from each of the two-dimensional collectors, T1, T2 and T3, and as their manifold structure coincides towards the smaller sized exit aperture 10u of the apparatus 60, there substantially increase the concentration ration of the apparatus (in this example by 1/8). As in the previously described embodiments, in some embodiments the radiation collection profile of the radiation collector 60 is adapted for improved coverage at northern (or southern) latitudes, by curving/twisting central horizon-plane reflective surfaces, as described hereinabove.

Figure 7A:
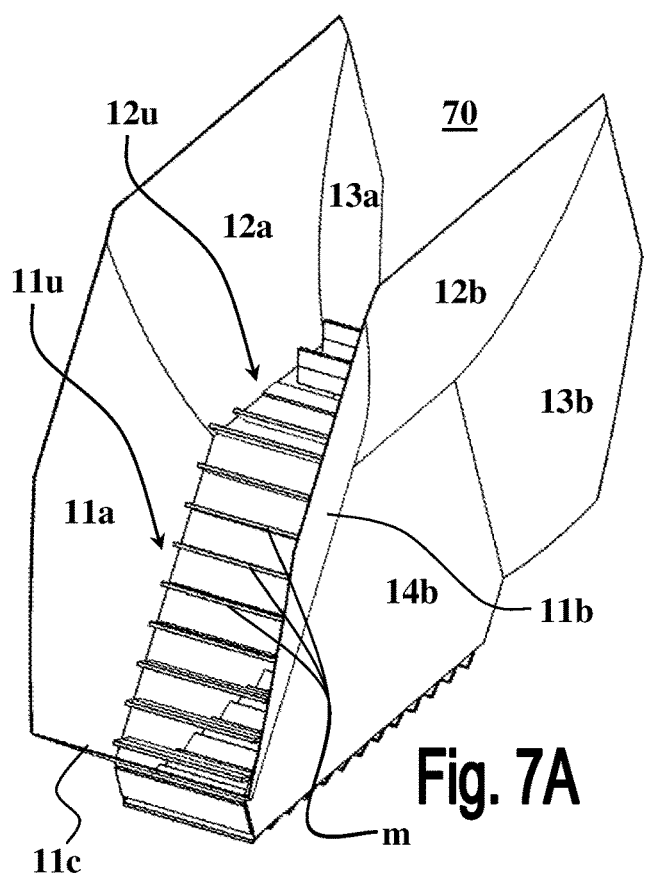
Figure 7B:
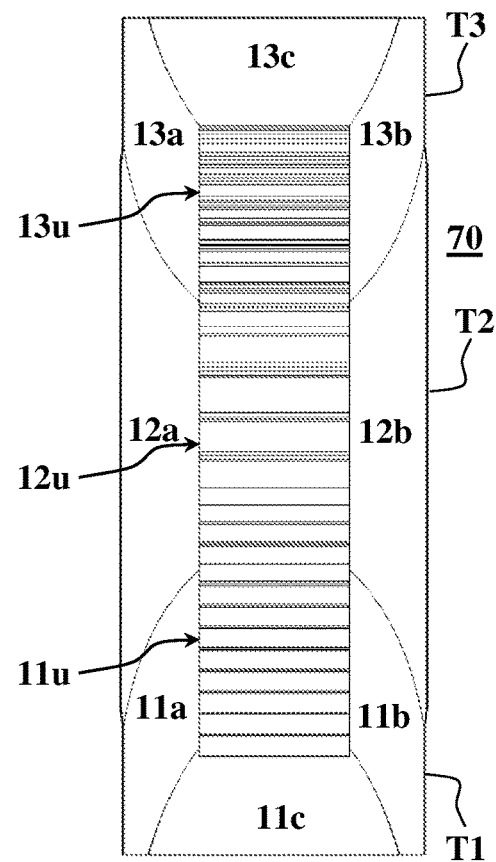
Figure 7C:
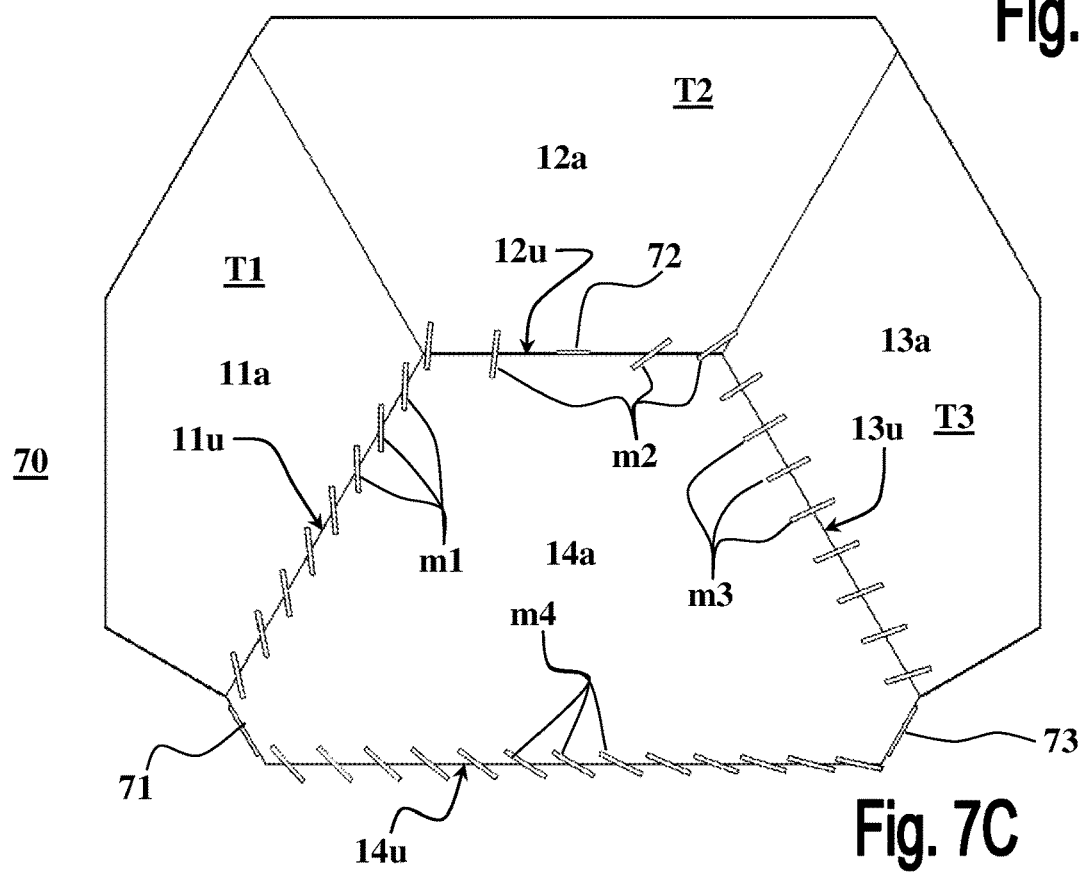
Figure 7H:
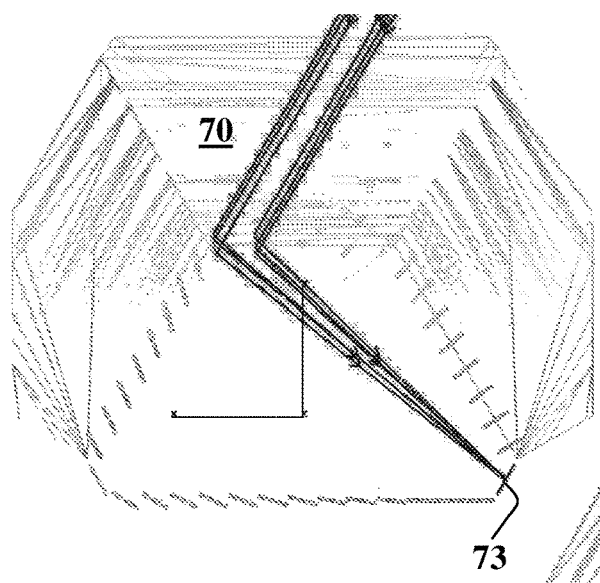
Figure 7I:
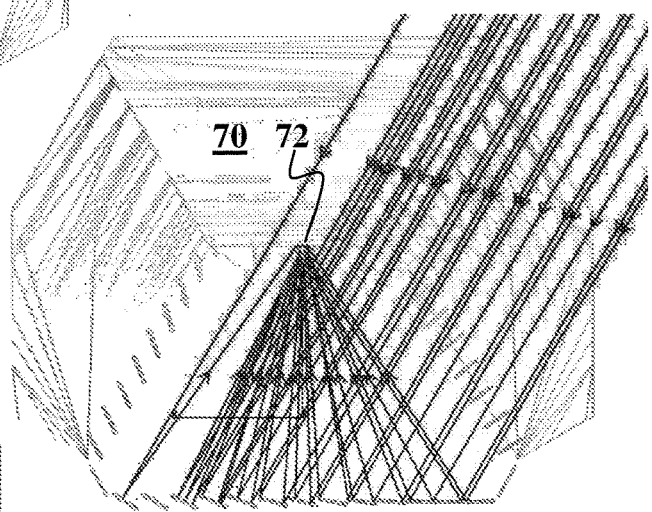
Figure 7J:
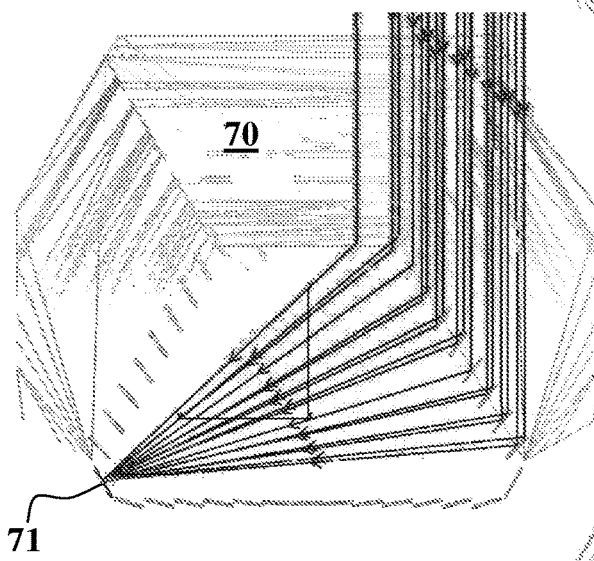
Figure 7K:
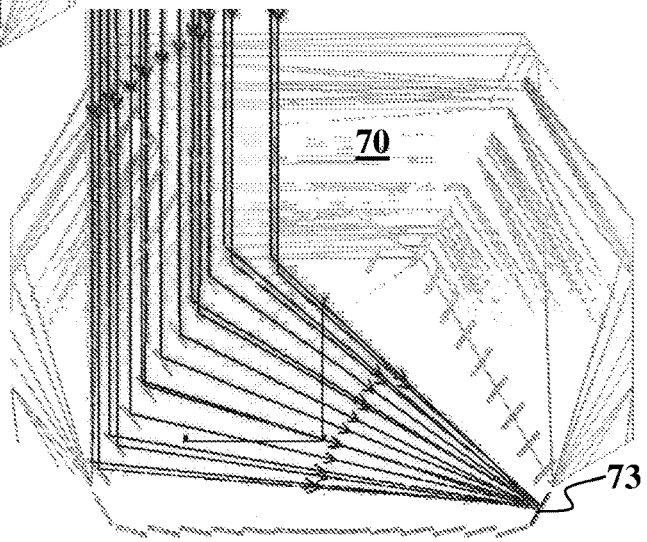
Figure 7L:
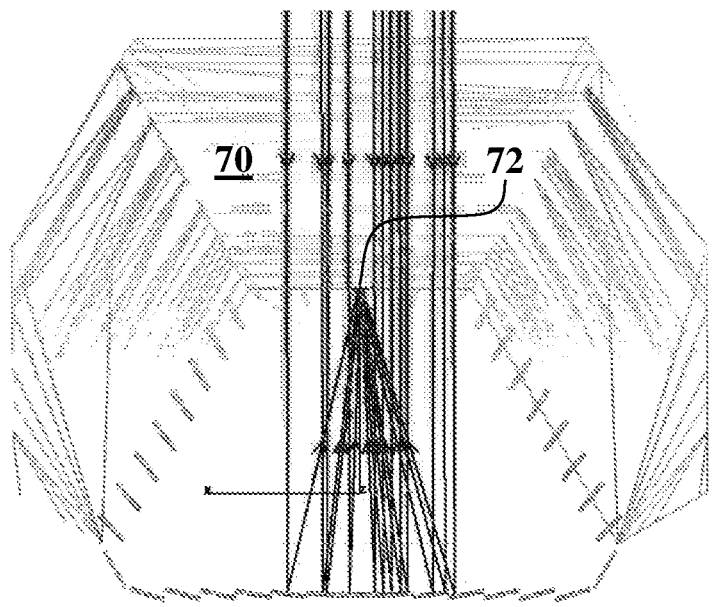

FIGS. 7A to 7C schematically illustrate a radiation collector apparatus 70 having substantially same structure as the radiation collector 10' shown in FIG. 1D, and further comprising a rotating mirrors (collectively referred to as mirror m) arrangement having a substantially isosceles trapezoidal shape. Each mirror m is a controllably rotatable panel, having reflective surface at both sides thereof. As seen, the at exit aperture each two-dimensional collector, T1, T2 and T3, and the base section 14u of the apparatus 70, comprises a set of spaced-apart controllably rotatable mirrors, m1, m2, m3, and m4, respectively. The radiation collector apparatus 70 comprises three different target surfaces, as follows; target surface 71 located between the base section 14u and the free end of the two-dimensional collector T1, target surface 72 located at (or adjacent) the center of the exit aperture 12u of the two-dimensional collector T2, and target surface 73 located between the base section 14u and the free end of the two-dimensional collector T3. While the target 72 is substantially parallel to the exit aperture 12u (and to the ground surface), targets 71 and 73 are tilted relative by about 100° to 150°, optionally by about 120°, relative to the base section 14u (and thus also to the ground surface).

A control unit and actuating means (not shown) are used to simultaneously adjust all of the angles of each of the mirrors m, and configured to thereby direct the light collected and concentrated by each of the two dimensional collectors, T1, T2 and T3, onto at least one of the target surfaces, 71, 72 and 73. Possible control schemes for setting the angles of the mirrors m to direct the collected and concentrated radiation onto selected target surfaces are shown in FIGS. 7D to 7L, wherein FIGS. 7D to 7F demonstrate radiation collection around 7:00 by target surfaces 71, 73 and 72, respectively, FIGS. 7G to 7I demonstrate radiation collection around 10:00 by target surfaces 71, 73 and 72, respectively, and FIGS. 7J to 7L demonstrate radiation collection around 12:00 by target surfaces 71, 73 and 72, respectively.

The use of the rotating mirrors m to direct the collected and concentrated radiation onto selected target surfaces provides substantially improved concentration ratios (1/30 concentration). In addition, with this embodiment, by proper control of the mirrors angles, a constant section towards the sun at all hours can be obtained and thus equal flux collection. In addition, since in this embodiment the rotating mirrors along each exit apertures and the base section concentrate radiation towards a target situated (roughly) at the opposing side/vertex, minimal mirror interference occurs during the mirrors rotations.

Figure 8:
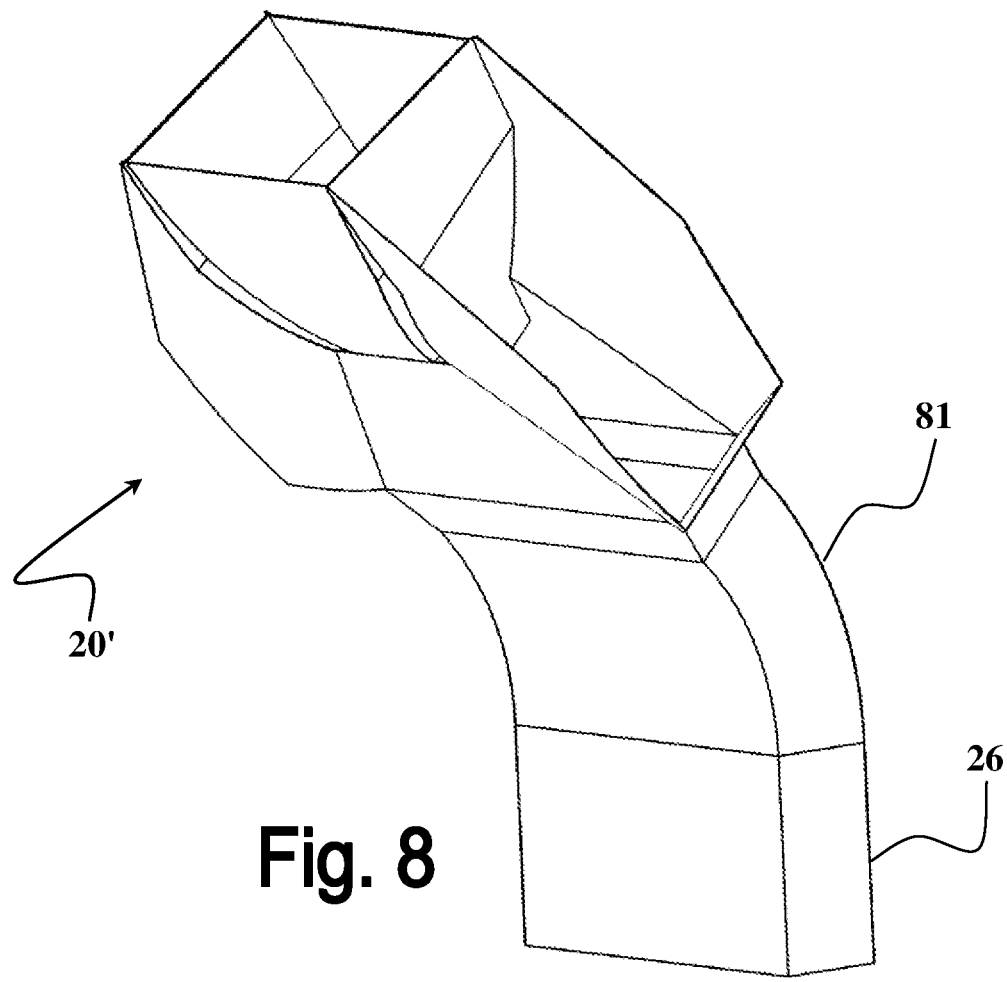
FIG. 8 is a perspective view of the radiation collector apparatus shown in FIGS. 5A to 5C operably installed using a curved light guide to collect radiation from a celestial radiation source.

FIG. 8 is a perspective view of the radiation collector assembly 80 comprising the radiation collector apparatus 20' shown in FIGS. 5A to 5C operably installed on a curved light guide 81 to collect radiation from a celestial radiation source. As seen, in this embodiment curved light guide 81 communicates the collected radiation between the collector 20' and the substantially vertical light guide 26, configured to deliver the collected radiation to a target location (e.g., into a building). In this way the collector 20' is provided readily set in proper orientation for optimal radiation collection, as may be required in a specific geographical latitude. Of course, all other embodiments illustrated and described herein can be similarly mounted on the curved light guide 81 in the same manner.

EXAMPLES

Figure 9:
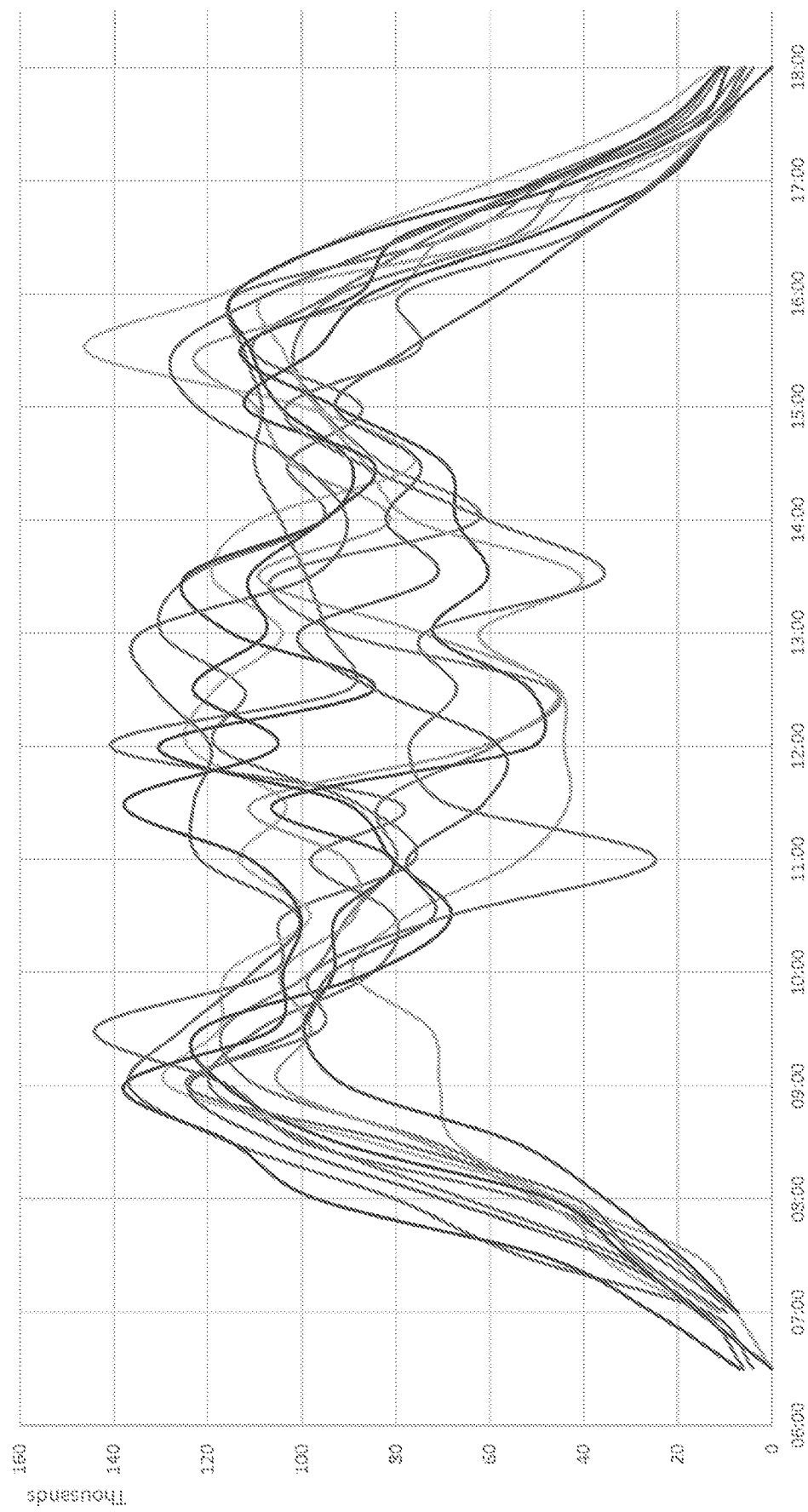
FIG. 9 show annual equatorial radiation collection plots as obtained by computer simulation for the radiation collector apparatuses shown in FIGS. 2A-2I.

FIG. 9 show annual equatorial radiation collection plots as obtained by computer simulation for the radiation collector apparatuses shown in FIGS. 2A-2I, simulating the annual performance at equatorial geographical regions (simulated for latitude 0° and 90° vertical angle i.e., exactly perpendicular to the horizon). As this concentrator was specifically designed for such angles, performance is very good throughout the year, resulting in large relative collection values from favorable solar angles.

Figure 10A:
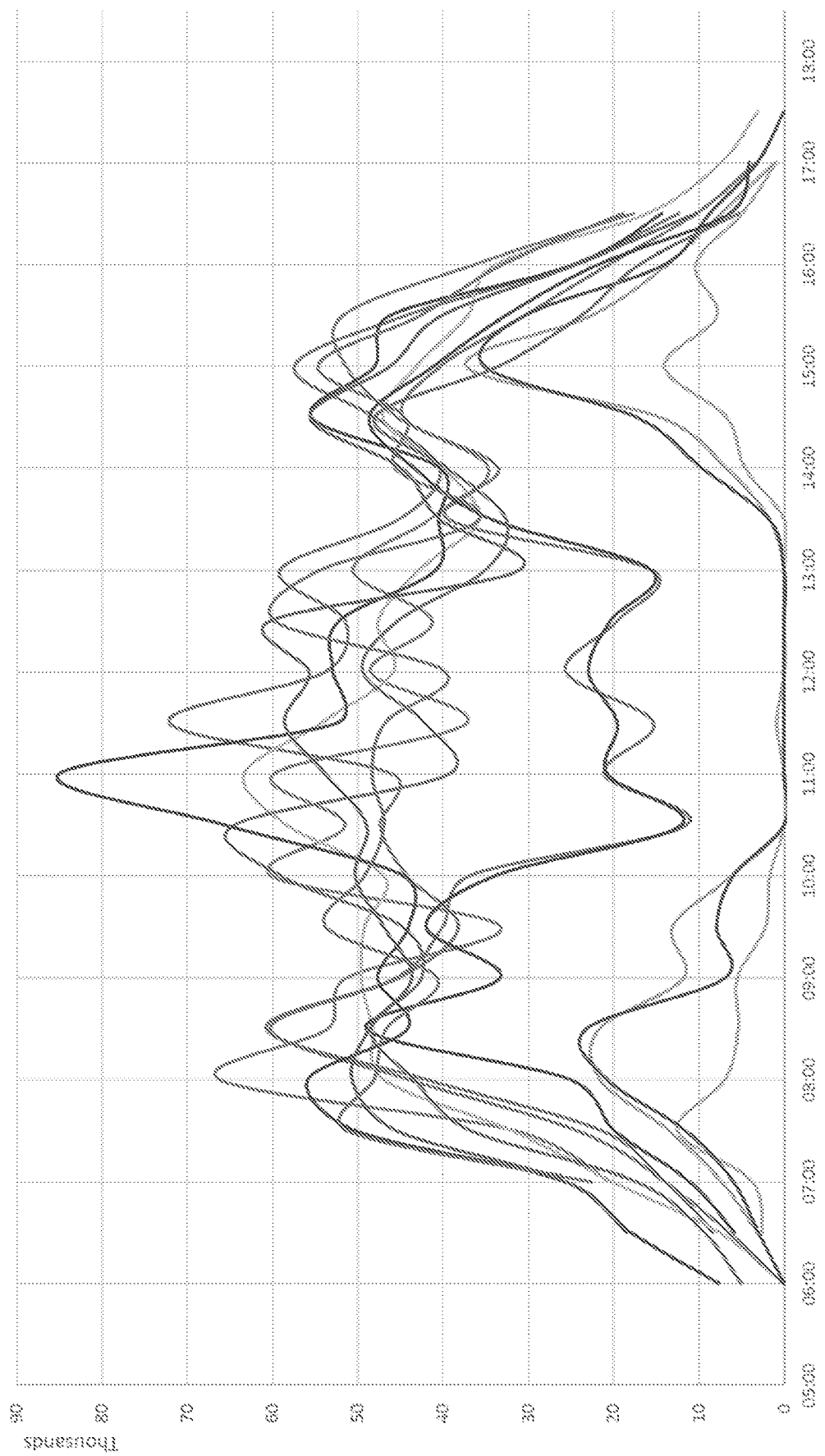

FIGS. 10A and 10B show annual radiation collection plots at latitude 33° and vertical angle of 45° tilt from the horizon, as obtained by computer simulation for the radiation collector apparatuses 20 shown in FIGS. 2A-2I and 20' shown in FIGS. 5A-5C, respectively. In this example solar raytracing simulations were performed at global location of Tel-Aviv in Israel, with a constant Solar source of power 1366 W/m^2 (arbitrary but constant), sampling at 0.5 hours intervals at the 21th of each month (Solstice is at that day so maximal and minimal values).

As seen in FIG. 10A, during May, June and July, the radiation collection profiles falls to zero during midday time using the collector apparatus 20 shown in FIGS. 2A-2I at latitude 33°. The results presented in FIG. 10B show the significant improvement achieved using the radiation collection apparatus 20' shown in FIGS. 5A-5C, comprising the curved/twisted central reflecting surfaces. As seen, the radiation collection profiles obtained using the radiation collection apparatus 20' are substantially uniform throughout the entire day, without the sudden falls obtained with the apparatus 20 and seen in FIG. 10A.

As described hereinabove and shown in the associated FIGS., the present invention provides improved radiation collector apparatuses adapted to optimize flux collection and concentration ratios at different geographical latitudes. While particular embodiments of the invention have been described, it will be understood, however, that the invention is not limited thereto, since modifications may be made by those skilled in the art, particularly in light of the foregoing teachings. As will be appreciated by the skilled person, the invention can be carried out in a great variety of ways, employing more than one technique from those described above, all without exceeding the scope of the invention.

The invention claimed is:

1. Apparatus for collection of incident radiation emitted from a moving radiation source, the apparatus comprising:
a central trough-shaped radiation collector comprising reflectors having a substantially trapezoidal shape, an entrance aperture defined by major bases of said reflectors, and an exit aperture defined by minor bases of said reflectors, for directing the collected radiation towards a target located below said exit aperture; and
two lateral trough-shaped radiation collectors, said lateral collectors having a same plane of symmetry, each one of said lateral collectors having an entrance aperture for collecting incident radiation from said moving radiation source and an exit aperture, said lateral collector extending from a respective trapezoid side of said central collector thereby defining an obtuse tilt angle between an elongated symmetry axis of the exit apertures of said central collector and a symmetry axis of the exit aperture of each of the lateral collectors, for directing the radiation collected by said lateral trough-shaped radiation collectors towards said target located below said exit apertures, central reflective surfaces of said central trough-shaped radiation collector are oriented such that a first one of said central reflective surfaces is curved away from said plane of symmetry and a second one of said central reflective surfaces is curved toward said plane of symmetry, and are configured to prevent flux collection losses during midday time periods of summer months and wasted coverage during midday time periods of winter months, to thereby provide a static radiation collector covering vertical movements of the radiation source that are a better fit to the radiation source trajectory and having substantially uniform radiation collection profiles throughout different seasons of the year.

2. The apparatus of claim 1, wherein the central collector is oriented so as to be displaced relative to the symmetry plane of the lateral collectors within a predefined displacement angle determined according to the defined geographical latitude of operation.

3. The apparatus of claim 1, comprising one or more guiding elements for guiding the radiation from the target surface to one or more remote location.

4. The apparatus of claim 1, wherein at least a portion of each reflector of the lateral collectors is curved towards the central collector to provide continuity therebetween.

5. The apparatus of claim 1, wherein a ratio of the lengths of the exit aperture of the central collector and of each exit aperture of the lateral collectors is about 1:1 to 1:3.

6. The apparatus of claim 1, comprising two guiding panels extending from the exit apertures of the two-dimensional collectors.

7. The apparatus of claim 1, wherein eat least one of the lateral collectors comprises a side reflector mounted at its free end.

8. The apparatus of claim 7, comprising at least one trap reflector mounted adjacent to the central collector substantially perpendicular to reflective surfaces of a respective one of said lateral collectors, thereby forming at least one lateral three-dimensional rectangular funnel-shaped radiation collector.

9. The apparatus of claim 8, comprising an additional two-dimensional trough-shaped collector coaxially enclosed inside the central two-dimensional collector and substantially perpendicular thereto, thereby forming a central three-dimensional rectangular funnel-shaped radiation collector.

10. The apparatus of claim 1, wherein the obtuse angle is about 100 degrees to 150 degrees.

11. The apparatus of claim 1, wherein at least one of the two-dimensional collectors is a compound parabolic concentrator (CPC) device.

12. A system for collecting radiation from a celestial radiation source, comprising: the light collection apparatus of claim 1; and a light guiding support for mounting said apparatus thereon, receiving light collected by said apparatus and delivering the collected light it-towards a target location, said light guiding support configured to set the apparatus mounted thereon in a defined orientation required for optimal radiation collection by the device at a certain latitude.

13. Apparatus for collection of incident radiation emitted from a moving radiation source, the apparatus comprising:

a central two-dimensional trough-shaped radiation collector comprising reflectors having a substantially trapezoidal shape, an entrance aperture defined by major bases of said reflectors, and an exit aperture defined by minor bases of said reflectors;

two lateral two-dimensional trough-shaped radiation collectors, said lateral and central collectors having a same plane of symmetry, each one of said lateral collectors having respective entrance and exit apertures, and extending from a respective trapezoid side of said central collector thereby defining an obtuse tilt angle between elongated symmetry axis of the exit aperture of said central collector and symmetry axis of the exit aperture of each of the lateral collectors;

two guiding panels extending from the exit apertures of the two-dimensional collectors; and a plurality of reflective ribs mounted between the guiding panels, said ribs substantially extending between the exit apertures of the two-dimensional collectors and an exit aperture of the apparatus.

14. Apparatus for collection of incident radiation emitted from a moving radiation source, the apparatus comprising:

a central two-dimensional trough-shaped radiation collector comprising reflectors having a substantially trapezoidal shape, an entrance aperture defined by major bases of said reflectors, and an exit aperture defined by minor bases of said reflectors;

two lateral two-dimensional trough-shaped radiation collectors, said lateral and central collectors having a same plane of symmetry, each one of said lateral collectors having respective entrance and exit apertures, and extending from a respective trapezoid side of said central collector thereby defining an obtuse tilt angle between elongated symmetry axis of the exit aperture of said central collector and symmetry axis of the exit aperture of each of the lateral collectors; and at least one array of rotatable mirrors configured to receive radiation from the exit aperture of a respective at least one of the collectors, axis of rotation of each mirror in said at least one array of rotatable mirrors being substantially perpendicular to the elongated axis of symmetry of the exit aperture.

15. The apparatus of claim 14, comprising two target surfaces, each positioned near a free end of one of the lateral collectors and facing the exit apertures of the central collector and of the other lateral collector.

16. The apparatus of claim 14, comprising an additional array of rotatable mirrors located in a base section of the apparatus.

17. The apparatus of claim 14, comprising actuating means configured to controllably affect rotary movements of the mirrors; and a control unit configured and operable to control operation of said actuating means and set orientation of at least some of the mirrors to direct the radiation outputted through the exit aperture towards at least one target surface or exit aperture of the apparatus.

18. The apparatus of claim 17, wherein the control unit is configured and operable to select a target surface for the at least some of the mirrors according to an angle of arrival of the radiation from the radiation source.

19. The apparatus of claim 17, comprising a light guiding support for mounting the apparatus thereon, receiving light collected by said apparatus and delivering the collected light towards a target location, said light guiding support configured to set the apparatus mounted thereon in a defined orientation required for optimal radiation collection by the device at a certain latitude.

20. Apparatus for collection of incident radiation emitted from a moving radiation source, said apparatus comprising:

a central three-dimensional rectangular funnel-shaped radiation collector having an entrance aperture for collecting incident radiation from said moving radiation source, and an exit aperture defined for directing the collected radiation towards a target located below said exit aperture; and two lateral three-dimensional rectangular funnel-shaped radiation collectors each having an entrance aperture for collecting incident radiation from said moving radiation source and an exit aperture, said lateral collectors having a same plane of symmetry, and each one of said lateral collectors extending from a respective end side of said central collector with a predetermined tilt angle defining an obtuse angle between elongated symmetry axes of exit apertures of said central and lateral collectors, for directing the radiation collected by said two lateral collectors towards said target located below said exit apertures, central reflective surfaces of said central three-dimensional trough-shaped radiation collector are oriented such that a first one of said central reflective surfaces is curved away from said plane of symmetry and a second one of said central reflective surfaces is curved toward said plane of symmetry, and are configured to prevent flux collection losses during midday time periods of summer months and wasted coverage during midday time periods of winter months, to thereby provide a static radiation collector covering vertical movements of the radiation source and having substantially uniform radiation collection profiles that are a better fit to the radiation source trajectory throughout different seasons of the year.

21. The apparatus of claim 20, wherein the central collector is tilted a predetermined tilt angle relative to the plane of symmetry, said tilt angle determined according to the defined geographical latitude of operation.

* * * * *

UNITED STATES PATENT AND TRADEMARK OFFICE
CERTIFICATE OF CORRECTION

PATENT NO. : 11,049,984 B2
APPLICATION NO. : 16/069323
DATED : June 29, 2021
INVENTOR(S) : Ofer Becker It is certified that error appears in the above-identified patent and that said Letters Patent is hereby corrected as shown below:

In the Claims

At Claim 7, Column 15, Line 35, after "wherein," delete --eat least--; insert --at least--;

At Claim 12, Column 15, Line 58, after "light," delete --it-towards--; insert --towards--.

Signed and Sealed this
First Day of March, 2022

Drew Hirshfeld
*Performing the Functions and Duties of the*
*Under Secretary of Commerce for Intellectual Property and*
*Director of the United States Patent and Trademark Office*